US011101932B2

(12) United States Patent
Beale et al.

(10) Patent No.: US 11,101,932 B2
(45) Date of Patent: Aug. 24, 2021

(54) TELECOMMUNICATIONS APPARATUS AND METHODS

(71) Applicant: SONY CORPORATION, Tokyo (JP)

(72) Inventors: Martin Warwick Beale, Basingstoke (GB); Shin Horng Wong, Basingstoke (GB)

(73) Assignee: SONY CORPORATION, Tokyo (JP)

( * ) Notice: Subject to any disclaimer, the term of this patent is extended or adjusted under 35 U.S.C. 154(b) by 89 days.

(21) Appl. No.: 15/775,051

(22) PCT Filed: Nov. 7, 2016

(86) PCT No.: PCT/EP2016/076794
§ 371 (c)(1),
(2) Date: May 10, 2018

(87) PCT Pub. No.: WO2017/084903
PCT Pub. Date: May 26, 2017

(65) Prior Publication Data
US 2018/0375616 A1    Dec. 27, 2018

Related U.S. Application Data

(60) Provisional application No. 62/257,591, filed on Nov. 19, 2015.

(51) Int. Cl.
| H04L 1/08 | (2006.01) |
| H04L 1/18 | (2006.01) |
| H04L 1/00 | (2006.01) |
| H04L 27/26 | (2006.01) |
(Continued)

(52) U.S. Cl.
CPC ............. *H04L 1/08* (2013.01); *H04L 1/1816* (2013.01); *H03M 13/6356* (2013.01);
(Continued)

(58) Field of Classification Search
CPC ... H04L 1/1819; H04L 1/1816; H04L 5/0007; H04L 5/001; H04L 1/0003; H04L 1/189;
(Continued)

(56) References Cited

U.S. PATENT DOCUMENTS

2003/0133497 A1* 7/2003 Kinjo ................... H04L 1/0041
375/152
2008/0090517 A1* 4/2008 Cheng .................. H04L 1/1825
455/39
(Continued)

FOREIGN PATENT DOCUMENTS

| EP | 2 068 482 A2 | 6/2009 |
| EP | 2 068 482 A3 | 6/2009 |
| WO | WO 2015/050417 A1 | 4/2015 |

OTHER PUBLICATIONS

"Technical Specification LTE; Evolved Universal Terrestrial Radio Access (E-UTRA); Medium Access Control (MAC) protocol specification (3GPP TS 36.321 version 12.7.0 Release 12)," ETSI TS 136 321, Version 12.7.0, Release 12, Oct. 2015, 79 pages.
(Continued)

*Primary Examiner* — April Y Blair
*Assistant Examiner* — Sazzad Hossain
(74) *Attorney, Agent, or Firm* — Xsensus, LLP

(57) ABSTRACT

A method of transmitting a block of data from a transmitter entity to a receiver entity in a wireless telecommunication system. The method includes: establishing a plurality of different redundancy versions for the block of data; transmitting the plurality of different redundancy versions for the block of data in a first sequence order in a first time period; and transmitting the plurality of different redundancy versions for the block of data in a second sequence order in a second time period, wherein the second sequence order is different form the first sequence order.

18 Claims, 10 Drawing Sheets

(51) Int. Cl.
*H03M 13/00* (2006.01)
*H04L 5/00* (2006.01)

(52) U.S. Cl.
CPC ....... *H03M 13/6362* (2013.01); *H04L 1/0003* (2013.01); *H04L 1/0009* (2013.01); *H04L 1/0013* (2013.01); *H04L 1/0067* (2013.01); *H04L 1/0071* (2013.01); *H04L 1/189* (2013.01); *H04L 1/1819* (2013.01); *H04L 1/1893* (2013.01); *H04L 5/001* (2013.01); *H04L 5/0007* (2013.01); *H04L 27/2607* (2013.01)

(58) Field of Classification Search
CPC ... H04L 1/0013; H04L 1/0009; H04L 1/0067; H04L 27/2607; H04L 1/08; H03M 13/6362; H03M 13/6356
See application file for complete search history.

(56) References Cited

U.S. PATENT DOCUMENTS

| | | |
|---|---|---|
| 2009/0028129 A1 | 1/2009 | Pi et al. |
| 2009/0147720 A1 | 6/2009 | Wang et al. |
| 2012/0051307 A1* | 3/2012 | Huang ................. H04L 5/0007 370/329 |
| 2014/0098761 A1* | 4/2014 | Lee ..................... H04W 72/005 370/329 |
| 2015/0326341 A1* | 11/2015 | Lorca Hernando ... H04L 1/0041 370/328 |
| 2016/0219641 A1 | 7/2016 | Chae et al. |
| 2017/0230149 A1* | 8/2017 | Wang ................... H04L 1/1819 |

OTHER PUBLICATIONS

Harri Holma, et al., "LTE for UMTS OF DMA and SC-FDMA Based Radio Access," John Wiley & Sons, Ltd., Jan. 2010, 8 pages.
"Technical Specification LTE; Evolved Universal Terrestrial Radio Access (E-UTRA); Multiplexing and channel coding (3GPP TS 36.212 version 12.6.0 Release 12)," ETSI TS 136 212, Version 12.6.0, Release 12, Oct. 2015, 96 pages.
International Search Report dated Jan. 30, 2018 in PCT/EP2016/076794 filed Nov. 7, 2016.
Chinese Office Action dated Jun. 19, 2020, issued in corresponding Chinese Patent Application No. 201680067785.1.

* cited by examiner

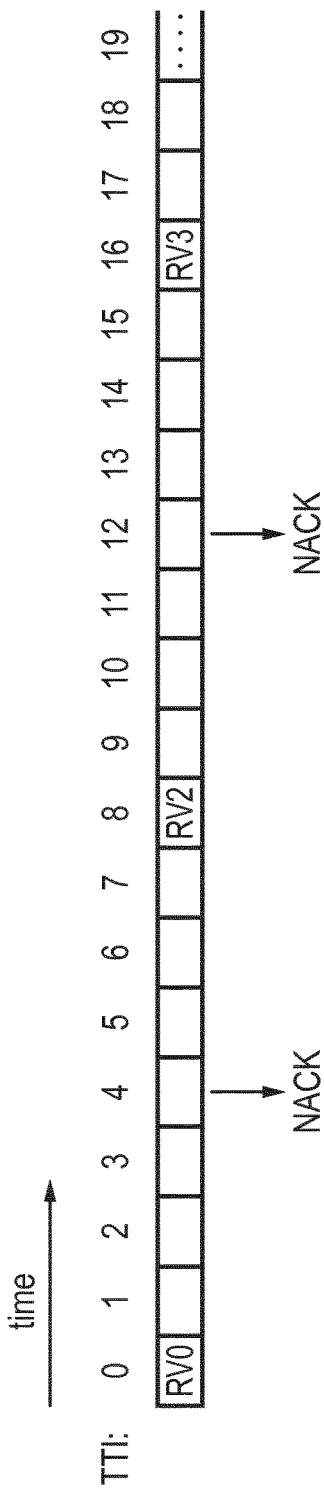
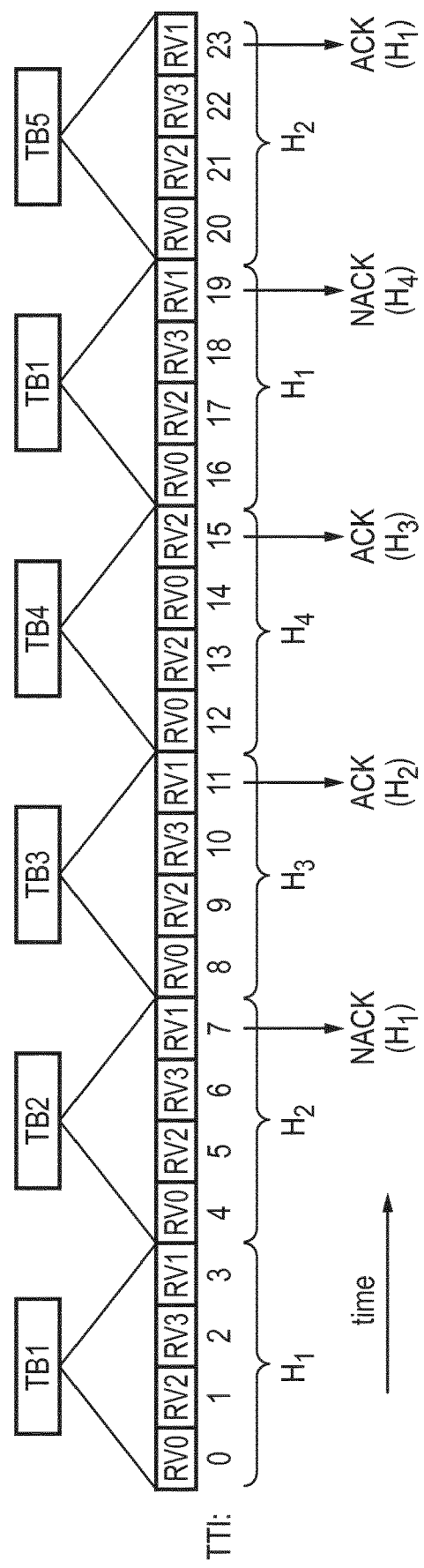
FIG. 1
FIG. 2

TELECOMMUNICATIONS APPARATUS AND METHODS

FIELD

The present disclosure relates to methods, systems and apparatus for use in wireless (mobile) telecommunications networks. In particular, embodiments of the disclosure relate to repeat transmission protocols and associated schemes for undertaking repeat transmissions of data in such networks, for example to enhance coverage.

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Third and fourth generation mobile telecommunication systems, such as those based on the 3GPP defined UMTS and Long Term Evolution (LTE) architecture are able to support more sophisticated services than simple voice and messaging services offered by previous generations of mobile telecommunication systems. For example, with the improved radio interface and enhanced data rates provided by LTE systems, a user is able to enjoy high data rate applications such as mobile video streaming and mobile video conferencing that would previously only have been available via a fixed line data connection. The demand to deploy third, fourth and higher generation networks is therefore strong and there is a corresponding desire in such networks to provide for reliable communications over increasingly large coverage areas.

One important aspect of wireless telecommunications networks is the provision of retransmission protocols to improve the overall reliability of data transmissions in circumstances where individual transmissions may fail. The provision of appropriate retransmission protocols becomes more significant in circumstances where there is a higher chance of failed transmissions. Accordingly, retransmission protocols can be especially significant where radio propagation conditions are more challenging, for example in respect of a terminal device at the edge of a cell.

Many of the principles associated with retransmission protocols, for example the provision of redundancy versions as discussed further below, can also be used to support enhanced coverage by providing repeat transmissions in respect of a block of data to be transmitted independently of any acknowledgement signalling. That is to say, a transmitter may be configured to undertake multiple transmissions of the same data to increase the likelihood of successful reception as a matter of course and not just as a consequence of having received negative acknowledgement signalling. Certain embodiments of the disclosure as described herein are concerned in particular with repeated transmission protocols, because of the similarity with some aspects of retransmission protocols triggered by acknowledgement signalling, some background on retransmission protocols is provided.

In conventional telecommunications networks, including LTE-based networks, retransmission protocols based around HARQ (Hybrid Automatic Repeat reQuest) procedures are often employed. See, for example, Section 5.4.2 in ETSI TS 136.321 v12.7.0 (2015 October) [1] for an overview of HARQ in respect of LTE uplink communications. The basic principle of hybrid ARQ (HARQ) is that in association with the transmission of a given block of data, for example in uplink from a terminal device (UE) to a base station (eNB), there is sent in the opposite direction (i.e. in this case downlink from the base station to the terminal device) some feedback (acknowledgement signalling) indicating whether the uplink transmission was successfully received. Acknowledgement signalling indicating successful receipt of the associated uplink transmission is commonly referred to as an 'ACK' while acknowledgement signalling indicating non-successful receipt of the associated uplink transmission is commonly referred to as a 'NACK'. In this regard it may be noted that the term "acknowledgment signalling" is used herein as a convenient term for the feedback/response signalling associated with retransmission protocols and the term is used to refer to this signalling generally and regardless of whether the signalling is indicating successful receipt of data (ACK) or unsuccessful receipt of data (NACK). That is to say the term "acknowledgment signalling" is intended to encompass both positive acknowledgement signalling (ACK signalling) and negative acknowledgement signalling (NACK signalling). In this regard acknowledgement signalling may also be referred to as ACK/NACK signalling, feedback signalling and response signalling.

Uplink data will typically include some data bits (systematic bits) and some parity bits associated with forward error correction coding (FEC). If a base station fails to correctly receive a given transmission of uplink data then NACK signalling will be sent back to the UE.

One retransmission approach would be for the UE to retransmit the data using a different combination of systematic and parity bits. In LTE, these different combinations are referred to as redundancy versions (RVs). An eNB receiving such a retransmission comprising a different RV is able to combine the two (or more) RVs in an effort to increase the likelihood of correct decoding. This process is known as an incremental redundancy process.

Another retransmission approach would be for the UE to retransmit the same RV (i.e. comprising the same set of systematic and parity bits). The eNB may then use an approach of maximal ratio combining or similar to optimally combine the two copies of the same data in an effort to increase the likelihood of correct decoding in a process known as Chase combining.

Another retransmission approach would be for the transmitter entity to transmit the same RV more than once and for the receiving entity to aggregate signalling received for the different symbols in a process known as symbol combining.

LTE networks provide for the possibility of combining these two principles, for example in uplink by a UE first transmitting a sequence of multiple transmissions (for symbol combining) of four different RVs (for incremental redundancy) without receiving any downlink ACK/NACK signalling. This may also be followed by a repeated transmission of the four different RVsif the base station is unable to correctly decode the uplink data from the initial sequence of four RVs. This approach is known as TTI bundling. When TTI bundling is applied, the redundancy version that is transmitted by the terminal device changes in a known sequence and this process of automatically changing the redundancy version over is known as an RV cycling process. If the same RV is repeated for multiple subframes before being cycled to another RV, symbol combining may be performed over the said multiple subframes.

An implementation employing symbol combining may achieve improved system performance through improved channel estimation and frequency tracking than an implementation that does not employ symbol combining. Incremental redundancy increases the likelihood of earlier successful reception.

In accordance with established and well understood LTE principles, a medium access layer (MAC) delivers a transport block (TB) to a physical layer (PHY) for uplink transmission once every transmission time interval (TTI). A TTI's duration corresponds with a subframe, i.e. 1 ms. From the TB, the PHY derives four RVs which can be used for respective (re)transmissions. In general the RVs may be transmitted in any order, but a commonly used default order is RV0-RV2-RV3-RV1.

Thus, in order to communicate a given TB in uplink, in one example a UE might first transmit a sequence of data bits corresponding to RV0 in a given TTI. For the purposes of explanation, a sequence of TTIs comprising an uplink radio frame structure may be considered as being sequentially numbered with the first RV for the data being transmitted in TTI 0. If the base station is able to decode the TB from the transmission it will communicate an ACK to the UE. On receipt of an ACK the HARQ process is able to receive the next transport block for uplink delivery. However, if the base station is unable to decode the TB from the transmission it will communicate a NACK to the UE. On receipt of a NACK the HARQ process causes a retransmission of the TB using RV2 to be made. If the base station is able to decode the TB from the combined transmissions of RV0 and RV2 it will communicate an ACK to the UE. If the base station still cannot correctly decodes the TB, it will send another NACK. This will result in the HARQ process retransmitting the TB using RV3, and so on.

To allow time for processing of the received signals and transmission/decoding of the HARQ feedback, in accordance with the LTE standards, for both uplink and downlink, the ACK/NACK signalling for basic HARQ operation is sent in the fourth subframe after an uplink transmission, and any required retransmission are sent in the fourth subframe after that in what is termed a stop-and-wait (SAW) operation.

The basic HARQ timing in this respect is schematically represented in FIG. 1. FIG. 1 schematically shows a series of TTIs for an LTE-based communications network. The TTIs are sequentially numbered 0, 1, 2 . . . and so on with increasing time relative to the TTI in which an initial transmission of RV0 associated with a particular TB is made. Thus, RV0 is transmitted in TTI 0 and the HARQ process governing transmission of the TB waits until TTI 4 to receive a corresponding ACK or NACK associated with this transmission. In the example of FIG. 1, a NACK is received in TTI 4, and so the HARQ process arranges for retransmission using RV2 in TTI 8. Again it is assumed this transmission does not allow the base station to correctly decode the TB, and so a NACK is received in TTI 12, resulting in the HARQ process arranging for retransmission using RV3 in TTI 16, and so on.

As can be seen from FIG. 1, the majority of TTIs (e.g. TTI 1 to TTI 7 and TTI 9 to TTI 15) play no role in the transmission of the transport block under control of the HARQ process discussed above. In order to increase efficiency a UE may therefore operate eight HARQ processes in parallel with each HARQ process governing transmission of different transport blocks. A first HARQ process operates with uplink data transmissions in TTIs 0, 8, 16, . . . etc., and downlink ACK/NACK signalling in TTIs 4, 12, 20, . . . as schematically shown in FIG. 1. A second HARQ process operates in parallel (but shifted one TTI) with uplink data transmissions in TTIs 1, 9, 17, . . . etc., and downlink ACK/NACK signalling in TTIs 5, 13, 21, . . . etc. Other HARQ processes operate on the other TTIs in a similar manner up to an eighth HARQ process operating with uplink data transmissions in TTIs 7, 15, 23, . . . etc., and downlink ACK/NACK signalling in TTIs 11, 19, 27, . . . etc. Each HARQ process is associated with its own buffer for uplink data.

Thus basic HARQ operation for uplink in a conventional LTE network provides for eight HARQ processes running in parallel and assigned to specific TTIs. The parallel HARQ processes are maintained by a single HARQ entity in the MAC layer at the UE so that while some HARQ processes stop-and-wait to receive ACK/NACKs, other processes can be transmitting data. Each uplink (UL) HARQ process may only transmit in specific TTIs as indicated above with reference to FIG. 1. If a particular HARQ process has nothing to transmit in a particular TTI to which it is assigned, no other UL HARQ process from that UE can make use of the TTI. This is, in some respects, in contrast to downlink HARQ processes for which there is increased scheduling flexibility for transmissions and any retransmissions.

In the context of an LTE-type network with uplink transmissions on PUSCH (physical uplink shared channel), the base station (eNB) can provide HARQ feedback (ACK/NACK signalling) for a given HARQ process in either of two ways.

A first way is on a PDCCH (physical downlink control channel) carrying DCI (downlink control information), e.g. using DCI Format 0. Among the fields the DCI message can contain are the following of relevance to UL HARQ:

a. The New Data Indicator (NDI).
b. The RV to be used.
c. The modulation and coding scheme (MCS) to be used.
d. An UL resource grant.

If NDI is toggled as compared with the last time it was received, the UE determines that it should proceed with transmitting new data (a new TB) in accordance with the rest of the information on PDCCH. If NDI is not toggled, the HARQ process at the UE determines that it should retransmit data associated with the previously transmitted TB using the potentially different RV, MCS, and grant indicated. This approach may be referred to as 'adaptive synchronous HARQ', since the MCS can be altered dynamically, but the fixed timeline represented in FIG. 1 must still be adhered to.

A second way is on PHICH (physical HARQ indicator channel). This encodes a single-bit HARQ Indicator (HI) with '1' for ACK and '0' for NACK. PHICH transmission is distributed across the whole system bandwidth in the control region at the start of a subframe in which it occurs. If the UE does not receive a PDCCH containing DCI Format 0, it uses the HI decoded from PHICH. If HI=0, the UE retransmits data associated with the previously-transmitted TB using the same MCS and grant as previously, but cycles through the RVs in a predefined order (e.g. RV0-RV2-RV3-RV1), as discussed above. This approach may be referred to as 'non-adaptive synchronous HARQ' since the MCS cannot be altered and the fixed timeline represented in FIG. 1 must be adhered to. If HI=1 (corresponding to an ACK), the UE does not retransmit but waits to receive PDCCH before it can continue transmitting. Such a PDCCH could arrive in the same subframe, and would typically have NDI toggled indicating data for a new TB should be transmitted on the associated uplink resource grant provided by the PDCCH.

If there are two spatial layers in use, an independent PHICH is sent for each spatial layer. If carrier aggregation (CA) is in use, there is one PHICH per layer per carrier, and PHICH is sent on the same component carrier as sends the uplink resource grant to which the HARQ feedback corresponds.

Multiple PHICHs can be sent in the same physical resources (in terms of time and frequency), with coinciding ("overlapping") PHICHs being scrambled by one of eight complex orthogonal Walsh sequences. The resources and sequence are signalled implicitly by the eNB as a function of parameters of the UL resource allocation.

The UE has an RRC configuration limiting the maximum total number of HARQ retransmissions before it must report failure to the Radio Link Control (RLC) layer.

The above has provided an overview of what might be termed "basic" HARQ operation in LTE. A possible drawback with this type of approach is that the delays between retransmissions of RVs associated with a TB which a base station does not correctly decode can introduce significant delays for uplink traffic. This is especially so in circumstances where radio channel conditions are relatively poor. An alternative HARQ mode which aims to reduce these issues is associated with so-called TTI bundling.

With TTI bundling the four RVs associated with a given TB are transmitted in four consecutive TTIs but the base station does not send any associated downlink ACK/NACK signalling until four TTIs after the final transmission. The same MCS and grant allocation are used in all four TTIs. This approach quickly provides a base station with all four RVs to improve the likelihood of early correct decoding of the associated TB at the cost of potentially wasteful transmissions (for example if the base station could have correctly decoded the TB from the first two RVs, the transmission of the next two RVs was not necessary). With TTI bundling a single HARQ process governs the retransmission protocol for the bundle of four TTIs in which the four RVs are transmitted.

The HARQ process timings associated with TTI bundling in LTE are schematically represented in FIG. 2. This is similar to, and will be understood from, the above-description of FIG. 1. As schematically shown in FIG. 2, redundancy versions associated with a first transport block, TB1, are transmitted in TTI is 0 to 3 (conventionally in the order RV0-RV2-RV3-RV1). Transmission of the four RVs associated with TB1 is collectively governed by a first HARQ process, H1. Acknowledgement signalling associated with a particular HARQ process for TTI bundling in LTE is transmitted in the fourth TTI after transmission of the last RV of the TB. If the acknowledgement signalling indicates the base station was unable to correctly decode the TB, the HARQ process arranges for the four RVs to be transmitted as another bundle starting in the 13th TTI after transmission of the last RV of the TB in the previous attempt. Compared to "normal" HARQ operation, for example as represented in FIG. 1, this represents a significant increase in potential latency if a base station is unable to decode a TB from a first bundled transmission of RVs.

Thus, referring to FIG. 2, the HARQ process H1 governing transmission of the TB1 waits until TTI 7 to receive a corresponding ACK or NACK associated with the transmission of TB1. In this example NACK signalling is received. The HARQ process H1 therefore operates to retransmit the RV bundle associated with TB1 in TTIs 16, 17, 18 and 19, and awaits associated acknowledgement signalling in TTI 23.

As with non-TTI bundling HARQ operation discussed above reference to FIG. 1, multiple TTI-bundled HARQ processes can operate in parallel with each process governing transmission of a different transport block. Thus, referring to FIG. 2, a second HARQ process H2 is shown controlling transmission of four RVs associated with TB2 in TTIs 4 to 7. In accordance with the defined timings discussed above, acknowledgement signalling for this HARQ process is received in TTI 11, and in this example it is assumed to be an ACK. Accordingly, HARQ process H2 clears its buffer of data associated with TB2 and prepares for transmission of a new TB in the next series of TTIs allocated to HARQ process H2 (i.e. TTIs 20 to 23). Other HARQ processes operate on the other TTIs in a similar manner with a total of four HARQ processes (labelled H1, H2, H3 and H4 in FIG. 2).

As noted above, HARQ processes generally involve (re) transmissions of so-called redundancy versions (RVs) associated with transport blocks for uplink communication on PUCSCH. The forward error correction (FEC) applied for PUSCH in LTE is a rate-1/3 turbo code. Thus the outputs of the FEC process are a stream of systematic bits (corresponding to the TB data for uplink) and two corresponding streams of parity bits. These three streams are individually interleaved and combined to form coded data for a buffer from which the RVs are drawn. The interleaved systematic bits are laid down first, followed by alternating bits from the two parity streams. This process is schematically illustrated in FIG. 4. Working down from the top, FIG. 4 begins with the transport block plus cyclic redundancy check bits (TB+CRC). This is turbo encoded to provide the systematic bits S and the two streams of parity bits P1 and P2. The streams are individually interleaved to generate respective interleaved versions of S, P1 and P2 which are arranged in a buffer associated with the HARQ process responsible for that particular TB in the order discussed above.

The RVs for uplink transmission are created by reading bits out of the buffer from different starting points depending on the RV being used, as schematically indicated in FIG. 4. The number of bits read out for each RV depends on current rate matching and MCS conditions.

When the end of the buffer is reached, readout wraps around to the beginning (i.e. it is a 'circular buffer'). The start point for RV number n is approximately n/4 along the length of the buffer from the start plus a fixed offset.

The above description of conventional HARQ operation is primarily focused on an LTE network operating in a frequency division duplex (FDD) mode. HARQ operation for an LTE network operating in a time division duplex (TDD) mode follows boarding the same principles, but with differences in timings associated with the variable arrangement of uplink-only and downlink-only subframes. The HARQ timeline for TDD is altered compared to FDD such that the ACK/NACK signalling arrives, as a general principle, either four subframes after the corresponding UL transmission or at a delay close to four subframes, depending on the uplink/downlink configuration. A similar alteration is made for the timing of retransmissions following receipt of NACK signalling. To make efficient use of resources, the specified number of uplink HARQ processes is different for different uplink/downlink configurations.

For TTI bundling, a bundle size of four TTIs is used for TDD, as with FDD. However none of the available uplink/downlink configurations in current versions of LTE specifications have four consecutive uplink subframes. This means for the set of TDD configurations which support TTI bundling, the four-TTI bundles are not necessarily contiguous in time. Similar rearrangements to the timeline are made with TTI bundling as for normal (non-bundled) TDD HARQ operation.

More details on HARQ operation and the associated aspects of conventional wireless telecommunications systems can be found in the relevant standards.

As noted above, there has been proposed for the purposes of providing coverage enhancement in wireless till application systems, repeat transmission protocols, which may also make use of redundancy versions for a block of data to be transmitted. In particular, different redundancy versions may be transmitted at different times, possibly in conjunction with multiple retransmissions of each redundancy version, with a view to providing a receiver with an increased chance of successful receipt of the block of data.

Accordingly, there are various well-established protocols that can be adopted to seek to enhance reliability in wireless telecommunications systems. Nonetheless, there remains a desire to optimise the use of repeat transmissions protocols in wireless telecommunications systems.

SUMMARY OF THE INVENTION

The present disclosure can help address or mitigate at least some of the issues discussed above.

Respective aspects and features of the present disclosure are defined in the appended claims.

It is to be understood that both the foregoing general description and the following detailed description are exemplary, but are not restrictive, of the present technology. The described embodiments, together with further advantages, will be best understood by reference to the following detailed description taken in conjunction with the accompanying drawings.

BRIEF DESCRIPTION OF DRAWINGS

A more complete appreciation of the disclosure and many of the attendant advantages thereof will be readily obtained as the same becomes better understood by reference to the following detailed description when considered in connection with the accompanying drawings wherein like reference numerals designate identical or corresponding parts throughout the several views, and wherein:

FIG. 1 schematically represents the transmissions and timings associated with a conventional non-TTI-bundle HARQ process in an LTE-type network;

FIG. 2 schematically represents the transmissions and timings associated with four conventional TTI-bundled HARQ processes in an LTE-type network;

DESCRIPTION OF EXAMPLE EMBODIMENTS

Figure 3:
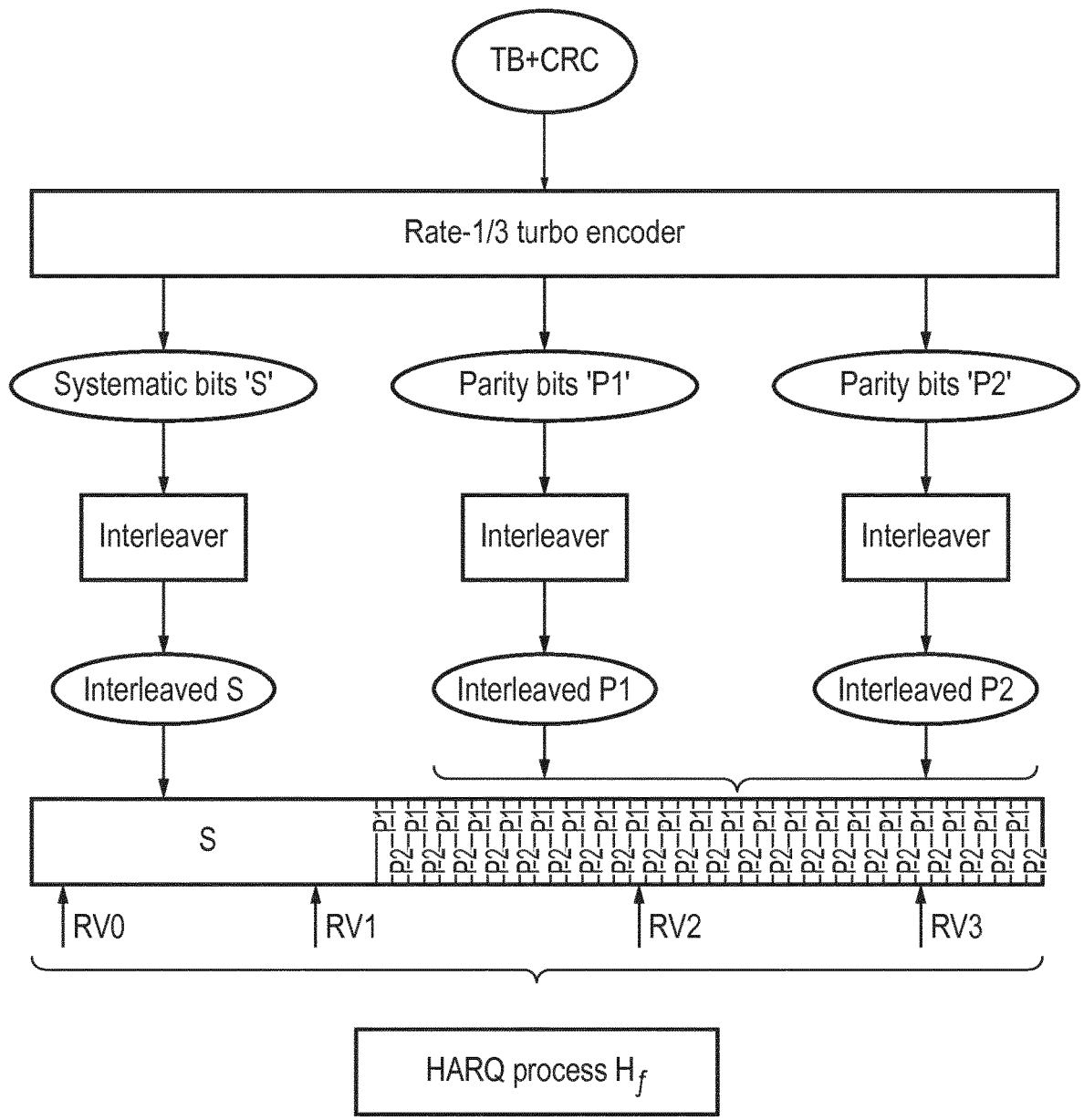
FIG. 3 schematically represents how redundancy versions associated with a transport block are generated for uplink transmission in an LTE-type network.
Figure 4:
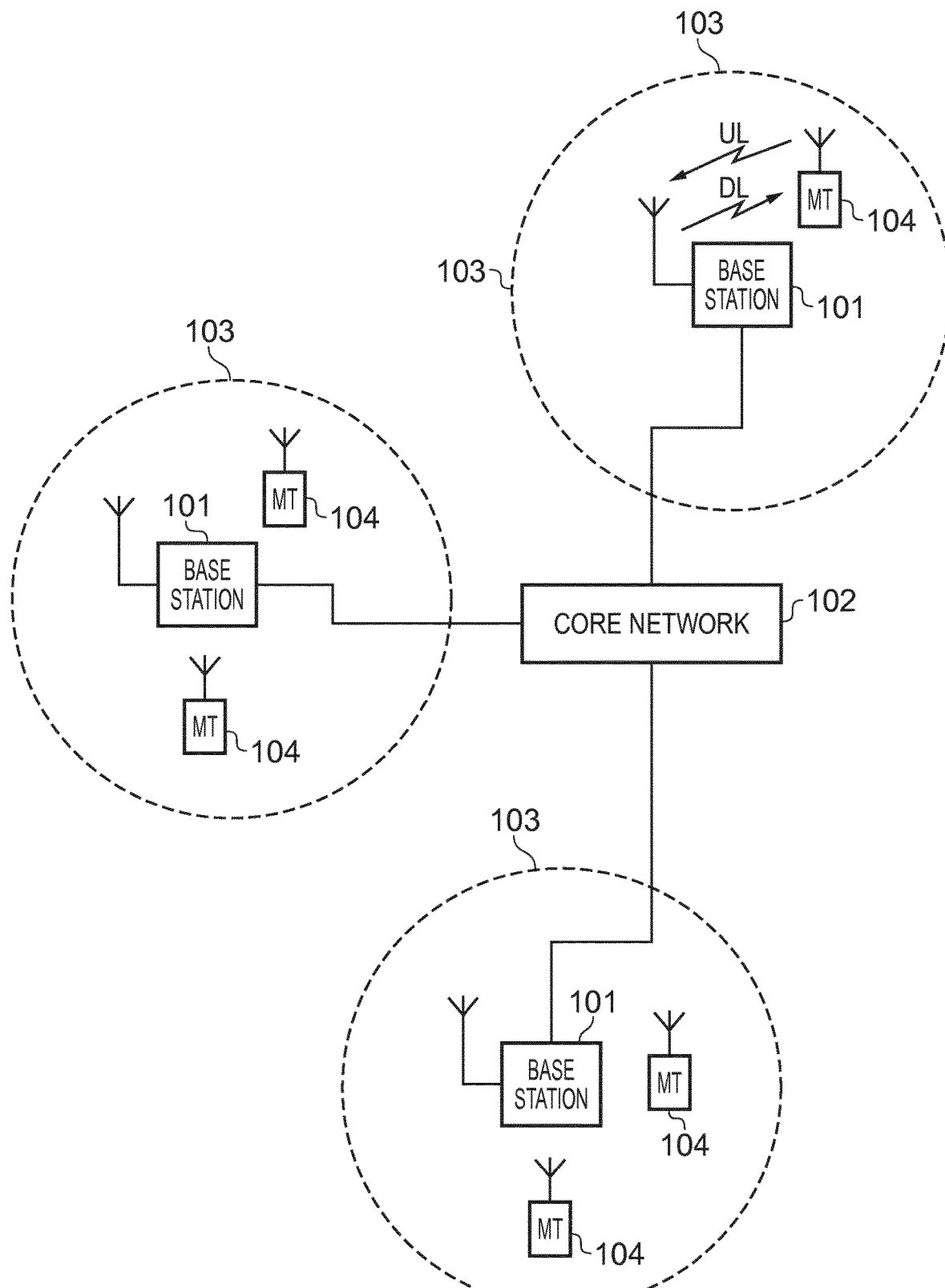
FIG. 4 schematically represents an example of a LTE-type wireless telecommunication network that may incorporate approaches in accordance with the disclosure.

FIG. 4 provides a schematic diagram illustrating some basic functionality of a mobile telecommunications network/system 100 operating in accordance with LTE principles and which may be adapted to implement embodiments of the disclosure as described further below. Various elements of FIG. 4 and their respective modes of operation are well-known and defined in the relevant standards administered by the 3GPP® body, and also described in many books on the subject, for example, Holma H. and Toskala A [2]. It will be appreciated that operational aspects of the telecommunications network which are not specifically described below may be implemented in accordance with any known techniques, for example according to the relevant standards.

The network 100 includes a plurality of base stations 101 connected to a core network 102. Each base station provides a coverage area 103 (i.e. a cell) within which data can be communicated to and from terminal devices 104. Data is transmitted from base stations 101 to terminal devices 104 within their respective coverage areas 103 via a radio downlink. Data is transmitted from terminal devices 104 to the base stations 101 via a radio uplink. The core network 102 routes data to and from the terminal devices 104 via the respective base stations 101 and provides functions such as authentication, mobility management, charging and so on. Terminal devices may also be referred to as mobile stations, user equipment (UE), user terminal, mobile radio, communications device, and so forth. Base stations, which are an example of network infrastructure equipment, may also be referred to as transceiver stations/nodeBs/e-nodeBs, and so forth.

Mobile telecommunications systems such as those arranged in accordance with the 3GPP defined Long Term Evolution (LTE) architecture may often use an orthogonal frequency division modulation (OFDM) based interface for the radio downlink (so-called OFDMA) and a single carrier frequency division multiple access scheme (SC-FDMA) on the radio uplink, but other approaches may be adopted in other systems.

Figure 5:
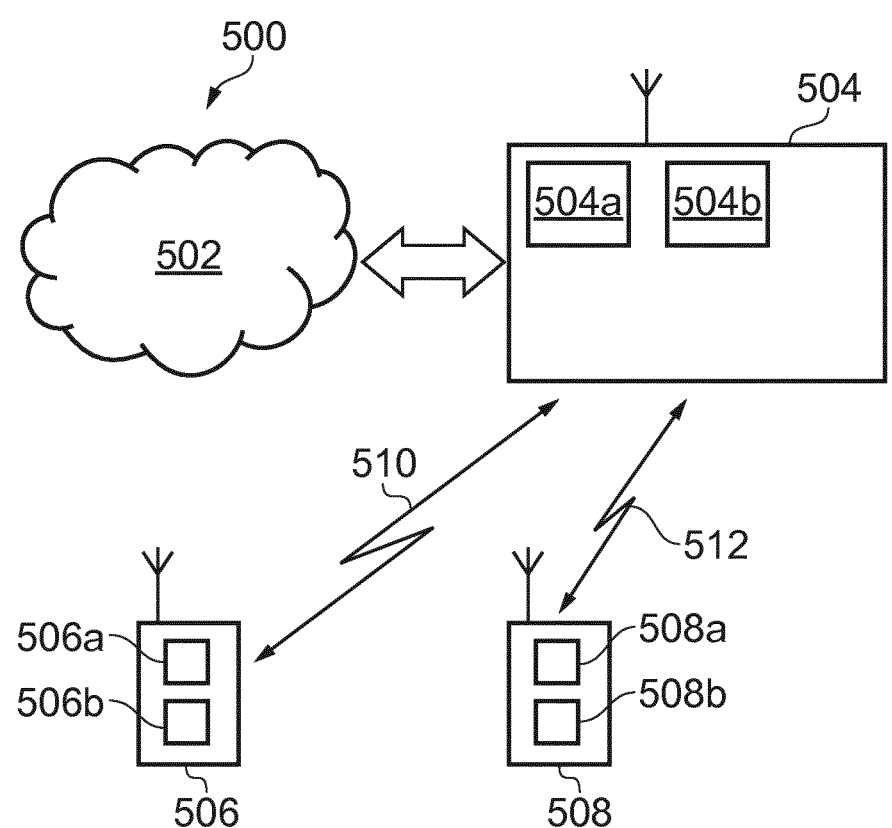
FIG. 5 schematically represents some aspects of a wireless telecommunications network configured to operate in accordance with certain embodiments of the present disclosure.

FIG. 5 schematically shows a telecommunications system 500 according to an embodiment of the present disclosure. The telecommunications system 500 in this example is based broadly around an LTE-type architecture. As such many aspects of the operation of the telecommunications system 500 are known and understood and are not described here in detail in the interest of brevity. Operational aspects of the telecommunications system 500 which are not specifically described herein may be implemented in accordance with any known techniques, for example according to the current LTE-standards.

The telecommunications system 500 comprises a core network part (evolved packet core) 502 coupled to a radio network part. The radio network part comprises a base station (evolved-nodeB) 504 coupled to a plurality of terminal devices. In this example, two terminal devices are shown, namely a first terminal device 506 and a second terminal device 508. It will of course be appreciated that in practice the radio network part may comprise a plurality of base stations serving a larger number of terminal devices across various communication cells. However, only a single base station and two terminal devices are shown in FIG. 5 in the interests of simplicity.

As with a conventional mobile radio network, the terminal devices 506, 508 are arranged to communicate data to and from the base station (transceiver station) 504. The base station is in turn communicatively connected to a serving gateway, S-GW, (not shown) in the core network part which is arranged to perform routing and management of mobile communications services to the terminal devices in the telecommunications system 500 via the base station 504. In order to maintain mobility management and connectivity, the core network part 502 also includes a mobility management entity (not shown) which manages the enhanced packet service, EPS, connections with the terminal devices 506, 508 operating in the communications system based on subscriber information stored in a home subscriber server, HSS. Other network components in the core network (also not shown for simplicity) include a policy charging and resource function, PCRF, and a packet data network gateway, PDN-GW, which provides a connection from the core network part 502 to an external packet data network, for example the Internet. As noted above, the operation of the various elements of the communications system 500 shown in FIG. 5 may be broadly conventional apart from where modified to provide functionality in accordance with embodiments of the present disclosure as discussed herein.

In this example, it is assumed the first and second terminal devices 506, 508 are both smartphone type terminal device communicating with the base station 504 in accordance with the principles described herein. However, it will be appreciated similar principles can be applied in respect of other types of terminal devices, for example machine type communication (MTC) type communication devices. The terminal devices 506, 508 respectively comprises a transceiver unit 506a, 508a for transmission and reception of wireless signals and a processor unit 506b, 508b configured to control the respective devices 506, 508. The respective processor units 506b, 508b may comprise a processor unit which is suitably configured/programmed to provide the functionality described herein using conventional programming/configuration techniques for equipment in wireless telecommunications systems. The respective transceiver units 506a, 508a and processor units 506b, 508b for each terminal device are schematically shown in FIG. 5 as separate elements. However, it will be appreciated that the functionality of these units can be provided for each terminal device in various different ways, for example using a single suitably programmed general purpose computer, or suitably configured application-specific integrated circuit(s)/circuitry. As will be appreciated the terminal devices 506, 508 will in general comprise various other elements associated with their operating functionality, for example a battery, a user interface, and so forth.

The base station 504 comprises a transceiver unit 504a for transmission and reception of wireless signals and a processor unit 504b configured to control the base station 504 to operate in accordance with the principles described herein. The processor unit 506b may comprise various sub-units, such as a scheduling unit, which operate together to provide functionality in accordance with the principles described herein. These sub-units may be implemented as discrete hardware elements or as appropriately configured functions of the processor unit. Thus, the processor unit 504b may comprise a processor unit which is suitably configured/programmed to provide the desired functionality described herein using conventional programming/configuration techniques for equipment in wireless telecommunications systems. The transceiver unit 504a and the processor unit 504b are schematically shown in FIG. 5 as separate elements for ease of representation. However, it will be appreciated that the functionality of these units can be provided in various different ways, for example using a single suitably programmed general purpose computer, or suitably configured application-specific integrated circuit(s)/circuitry. It will be appreciated the base station 504 will in general comprise various other elements associated with its operating functionality.

Figure 6:
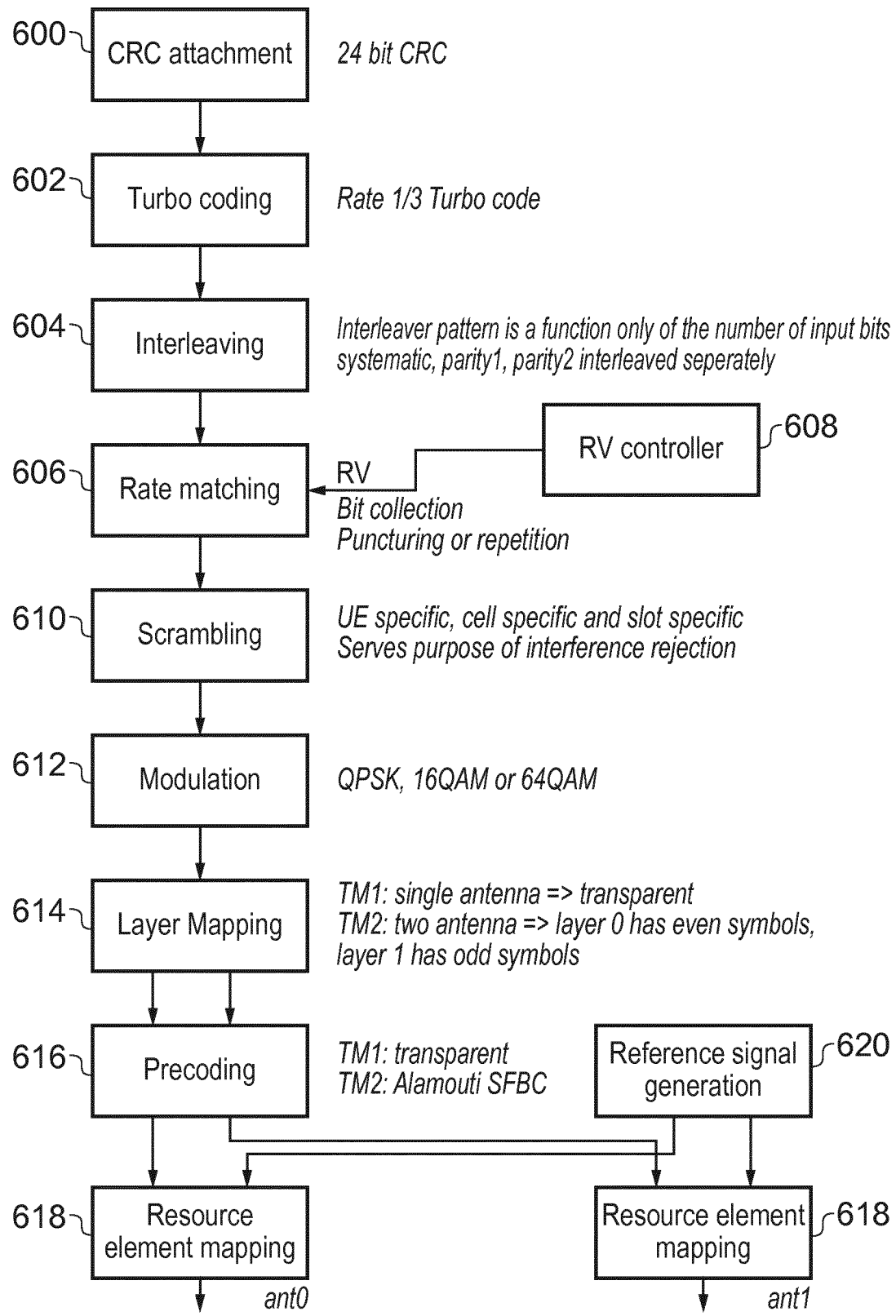
FIG. 6 schematically illustrates some aspects of established transport and physical channel processing chains for PDSCH (Physical Downlink Shared Channel) transmission in an LTE-based wireless telecommunications system.

FIG. 6 schematically illustrates some aspects of established transport and physical channel processing chains for PDSCH (Physical Downlink Shared Channel) in an LTE-based wireless telecommunications system in respect of a transport block (TB) for transmission. The transport channel processing chain for the PUSCH (Physical Uplink Shared Channel) is similar. As will be understood, the principles described herein may be applied in respect of downlink communications and uplink communications. For the sake of a concrete example, this description mainly focuses on a downlink communication scenario, for example in respect of PDSCH in an LTE-based wireless telecommunications system, but, as will be readily understood, the same principles can also be applied in respect of uplink communications, and indeed in respect of device-to-device commutations. That is to say, the operating principles described herein are generally applicable in respect of communications between a first communications/network entity and a second communications/network entity operating in a wireless telecommunications system and the specific nature of the respective entities, for example whether they are a base station, or other network infrastructure equipment, or a terminal device, is not significant to the principles underlying the approaches described herein.

As will be recognised, the processing chain represented in FIG. 6 is represented in simplified form in only representing transmit modes 1 and 2 (where Alamouti modes are employed), whereas in practice more complicated modes will usually be supported (e.g. to support MIMO), and also the transport channel processing chain is only shown for single codeblock transmissions. As is conventional, for larger transport block sizes, transport blocks are typically segmented/concatenated into smaller code blocks around the Turbo coding function.

Various elements of the transport channel processing chain represented in FIG. 6 are conventional and well understood, and may be summarised as follows:

CRC attachment 600: 24 bit CRC is added to the transport block (the transport block is the input message that is to be transmitted)

Turbo coding 602: Forward error correction coding is applied. LTE uses a rate 1/3 Turbo code. In such a code, for every one input bit, three output bits are produced: namely one systematic bit and two parity bits. However, it will be appreciated the approaches described herein are not limited to communication systems that employ Turbo codes, but may, for example, be similarly adopted in systems employing other forward error correction coding schemes, such as convolutional codes and various forms of block codes (e.g. Low Density Parity Check, LDPC, codes).

Interleaving 604: The bit order of the bits produced by the Turbo code is changed. This helps to ensure that bursts of errors are not fed into the Turbo decoding function, if received bits are subject to burst errors (e.g. when the communication channel fades).

Rate matching 606: The rate matching function either punctures or repeats its input bits. The rate matching function matches the number of input bits to the number of bits that can actually be transmitted over the radio-interface. The rate matching function is controlled by an RV (redundancy version) controller. The RV controller indicates a redundancy version that the rate matching function should produce.

When the rate matching function punctures bits, it does so by applying a puncturing pattern (the puncturing pattern defines which set of input bits will be transmitted and which set of input bits will not be transmitted). The RV indicates which puncturing pattern shall be applied.

As a simple example, consider a situation in which the number of bits that can be transmitted over the air interface is exactly half the number of input bits to the rate matching function. In this case, the rate matching function converts an input 1/3 code rate into an output 2/3 code rate. By way of a concrete example, in this situation the following redundancy versions might be applied (in the following notation the output bits are identified as "bx" (e.g. b0, b1, b2, b3) and input bits are identified as "ax" (e.g. a0, a1, ... a7)):

RV0: output bit=every even indexed input bit: i.e. {b0, b1, b2, b3}={a0, a2, a4, a6}
RV1: output bit=every odd indexed input bit: i.e. {b0, b1, b2, b3}={a1, a3, a5, a7}
RV2: output bit pair=every even indexed input bit pair: i.e. {b0, b1, b2, b3}={a0, a1, a4, a5}
RV3: output bit pair=every odd indexed input bit pair: i.e. {b0, b1, b2, b3}={a2, a3, a6, a7}

Thus, if the transmitting entity (e.g. the base station 504 in downlink or terminal device 506, 508 in uplink) transmits RV0 in an initial transmission, and RV1 in a subsequent transmission, then after the second transmission, the receiver entity will have received all of the bits that were produced by the Turbo encoder (assuming no transmissions failure).

As will be understood, there are more sophisticated rate matching function that can be used (in comparison to the above simple example). For example, the circular buffer rate matching function specified in Section 5.1.4 in ETSI TS 136.212 v12.6.0 (2015 September) [3].

Different redundancy versions may also have the bits ordered in different ways in order to map the bits to constellation points in the modulation symbol (in the subsequent modulation function). This function is can be referred to as "constellation rearrangement".

RV controller 608: The RV controller indicates to the rate matching function the redundancy version that is to be applied. The RV controller can determine the RV to use either through indication in a control channel (for example in an LTE-based network the Physical Downlink Control Channel, PDCCH, or variants of that channel, such as the Enhanced Physical Downlink Control Channel, ePDCCH, or Physical Downlink Control Channel for MTC, M-PDCCH); or through a known (i.e. predefined/derivable) RV cycling pattern (for example, the first transmission could always use RV0, the second transmission could always use RV2, the third transmission could always use RV3, the fourth transmission could always use RV1, which as noted above is a commonly used default ordering in an LTE context).

Scrambling 610: The bit stream is scrambled with a known scrambling sequence. This can help to minimize intercell interference.

Modulation 612: The bits stream is modulated to produce modulation symbols. Typical modulations that could be applied are QPSK and 16QAM.

Layer mapping 614: The modulation symbols are divided into streams, where each stream corresponds to a "layer".

Precoding 616: Modulation symbols from the different layers are combined, e.g. using a Space Frequency Block Code (SFBC). Alamouti coding could be applied in an SFBC mode. When the signal is transmitted using a single transmit antenna, the precoding function is transparent.

Resource element mapping 618: The modulation symbols produced by the precoding function are mapped to resource elements using a known mapping rule (in LTE, a resource element is a single subcarrier within a single OFDM symbol). In the example represented in FIG. 6, there are assumed to be two antennae (ant0 and ant1) associated with the transmitting entity, and hence two resource element mapping blocks. It will be appreciated there are other processing elements that are not shown in the figure for simplicity, for example prior to resource element mapping, such as Fast Fourier Transform (FFT) operations.

Reference signal generation 620: Reference signals (i.e. known modulation symbols) are transmitted in known resource elements to allow the UE to perform channel estimation, to facilitate coherent demodulation of the signal at the receiver.

In order to seek to improve coverage, a transmitting entity (transmitter) may repeat transmissions. The receiving entity (receiver) may thus combine the received repeated signals, thereby increasing the effective signal to noise ratio of the received signal with a view to improving the chances of successful decoding of the received signal. As noted above, the transmitter can either transmit identical redundancy versions when repeating transmissions for symbol combining (e.g. repeatedly transmit RV0), or it can cycle the redundancy version that is applied to the repeated transmissions. For example, the transmitter can transmit the following sequence of redundancy versions, relating to the same transport block: RV0, RV2, RV3, RV1. Redundancy version cycling (RV cycling/incremental redundancy) is known to improve system performance.

Figure 7:
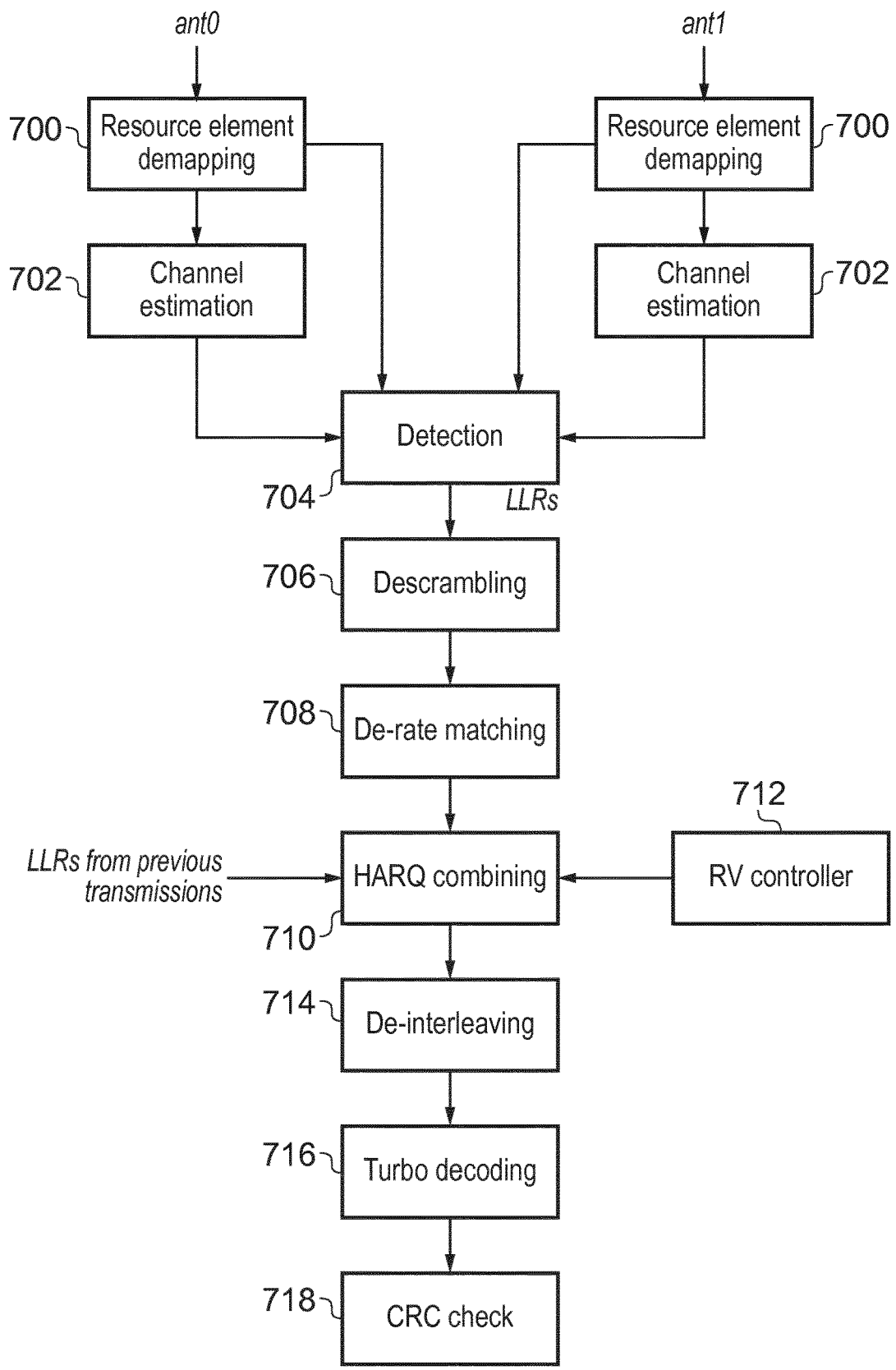
FIG. 7 schematically illustrates some aspects of established transport and physical channel processing chains for PDSCH (Physical Downlink Shared Channel) reception in an LTE-based wireless telecommunications system.

FIG. 7 schematically illustrates some aspects of established transport and physical channel processing chains for PDSCH (Physical Downlink Shared Channel) reception in an LTE-based wireless telecommunications system in respect of a transport block (TB) being received. The transport channel processing chain for a section of the PUSCH (Physical Uplink Shared Channel) is similar. In this regard, FIG. 7 represents the receiver-side processing chain corresponding to the transmitter-side processing chain represented in FIG. 6.

Elements of the transport channel processing chain represented in FIG. 7 are conventional and well understood, and may be summarised as follows:

Resource element demapping 700: The received modulation symbols are demapped from the resource elements using the known mapping rule (in LTE, a resource element is a single subcarrier within a single OFDM symbol). In the example represented in FIG. 7, there are assumed to be two antennae (ant0 and ant1) associated with the receiving entity, and hence two resource element demapping blocks.

Channel estimation 702: The channel estimation algorithm for each antenna channel compares the received reference symbols to the known transmitted reference symbols in order to estimate the channel (e.g. the magnitude and phase distortion applied at each time interval and at each subcarrier frequency). The channel estimation can be improved by averaging the received channel estimates across multiple subframes, or across multiple subcarriers. As part of the averaging process, the channel estimator may combine samples of multiple received subframes or symbols before performing other channel estimation operations. The combination of multiple received subframes or symbols is termed "symbol combining". Symbol combining relies on the transmitted signals being identical for the time duration over which symbol combining is to be performed.

Detection 704: The detection process may take the form of an equalizer and decision circuit, or other algorithms such as Maximum Likelihood Detection (ML Detection), or reduced complexity versions of ML decoding, such as Soft Sphere Decoding (SSD decoding). When symbol combining is performed, the detection process can be performed on the symbol combined signal. The output from the detection process comprises LLRs (log-likelihood ratios).

Descrambling 706: The bit stream is descrambled to in effect reverse the known scrambling sequence applied at the transmitter side (see element 610 in FIG. 6).

De-rate matching 708: The bit stream is de-rate matched to in effect reverse the rate-matching applied at the transmitter side (see element 606 in FIG. 6).

HARQ combining 710: The HARQ combining function combines and accumulates LLRs from the repeated or re-transmitted transmissions of the same transport block. The HARQ combining function can combine transmissions with different redundancy versions, since the combination is performed on LLRs (log-likelihood ratios), where each LLR corresponds to one output bit of the Turbo coder. With knowledge of the redundancy version, the HARQ combining function is able to determine which input LLRs correspond to which Turbo coder bits.

RV controller 712: The RV controller controls the rate matching function such that the same redundancy version is applied at both the transmitter and the receiver.

De-interleaving 714: The data are de-interleaved to in effect reverse the interleaving applied at the transmitter side (see element 604 in FIG. 6).

Turbo decoding 716: The data are Turbo decoded to in effect reverse the coding applied at the transmitter site side (see element 602 in FIG. 6).

CRC check 718: A CRC check is performed to seek to detect errors.

Figure 8:
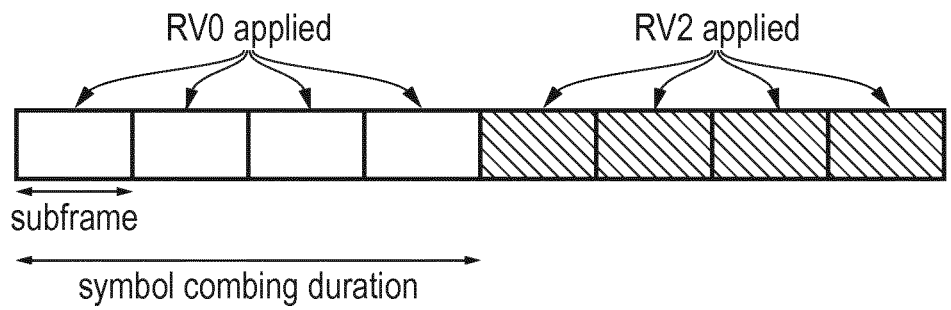
FIG. 8 is a schematic representation of an approach for using redundancy versions for repeat transmissions in accordance with previously proposed techniques.

FIG. 8 is a schematic representation of one approach for using redundancy versions to allow for symbol combining at the receiving entity in accordance with conventional techniques. The figure schematically represents a sequence of eight subframes with an indication of which redundancy version is applied for each subframe. In this example, redundancy version RV0 is applied for the first four subframes represented in the figure and redundancy version RV2 is applied for the subsequent four subframes. The symbol combining function at the receiver is able to operate on those subframes for which the same redundancy version is applied. Hence the symbol combining function can operate on the first four subframes (those using RV0) and then on the second set of four subframes (those using RV2). By virtue of symbol combining, the channel estimation and decoding functions at the receiver can operate on signals with an effective higher signal to noise ratio, thereby improving performance and allowing for reducing receiver complexity. Furthermore, the approach represented in FIG. 8 in which different redundancy versions are used in different groups of subframes also provides for incremental redundancy (RV cycling). Thus, the advantages associated with both techniques (symbol combining and RV cycling) can be realised with this signal format.

Another technique known to provide for improved system performance, for example in terms of communications reliability, in a frequency selective channel (i.e. a where fading occurs in different portions of the channel bandwidth) is frequency hopping. In a frequency hopped signal, the physical resource blocks (PRB) or narrowbands used to transmit the signal may be changed from one subframe to the next. In an LTE-based context a physical resource block consists of 12 subcarriers and 7 OFDM symbols (for a signal constructed with a normal cyclic prefix). A PRB-pair consists of two PRBs and hence consists of 12 subcarriers and 14 OFDM symbols (for the normal cyclic prefix case).

Figure 9:
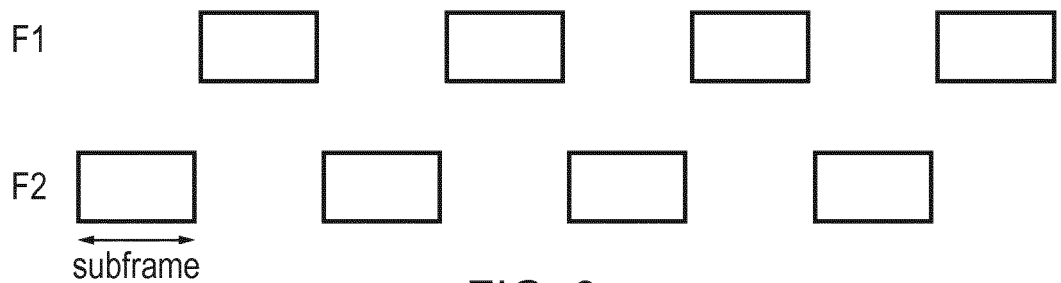
FIG. 9 is a schematic representation of one approach for using frequency hopping to allow for frequency diversity in accordance with previously proposed techniques.

FIG. 9 schematically represents a frequency hopped signal, where the signal is hopped on a subframe-by-subframe basis between frequencies F1 and F2. When the same data is transmitted at two different frequencies in such a frequency hopped pattern, the communication can be more resilient to narrowband fading that might arise in respect on one of the channels, for example as compared to schemes that use only one of the channels. It will be appreciated that FIG. 9 represents a fairly simple frequency-hopping pattern (i.e. hopping between two frequencies for alternating subframes), but more sophisticated frequency hopping patterns can be adopted. However, a simple frequency-hopping pattern, such as the present in FIG. 9, can be advantageous in terms of simplifying radio resource scheduling.

Frequency hopping approaches, such as represented in FIG. 9 can be combined with the use of redundancy versions to seek to further improve communications liability. A schematic example of this is represented in FIG. 10.

Figure 10:
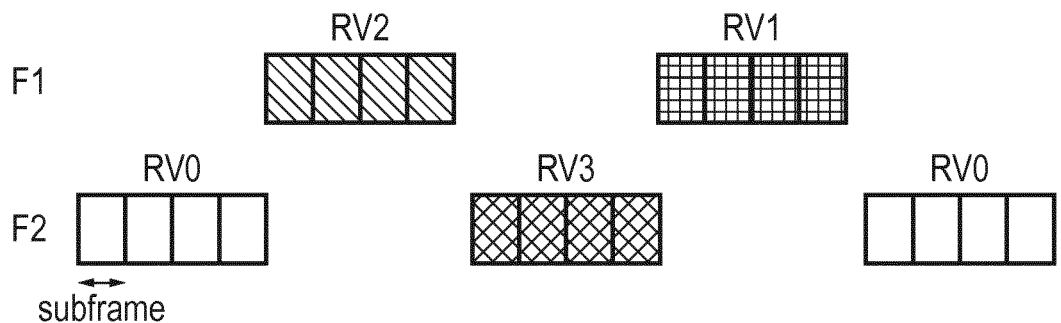
FIGS. 10 and 11 are schematic representations of approaches for using redundancy versions for repeat transmissions with frequency hopping in accordance with previously proposed techniques.

Thus, FIG. 10 schematically represents a sequence of 20 subframes which are arranged in to groups of four subframes alternating between a first frequency F1 and a second frequency F2. In the approach of FIG. 10, RV0 is applied for the first four (i.e. leftmost) subframes with transmissions made in frequency band F2, thereby allowing symbol combining to be applied at the receiver in respect of these subframes. RV2 is then applied for the next four subframes with the transmissions made in frequency band F1, thereby allowing symbol combining to be applied at the receiver in respect of the subframes, while also providing for RV cycling based redundancy in respect of the use of RV0 in the first four subframes and RV1 in the next four subframes, and also making use of frequency hopping. The next four subframes have RV3 applied with transmissions in frequency band F2. The next four subframes have RV1 applied with transmissions in frequency band F1, and so on as represented in the figure. Thus, in accordance with this approach a receiving device can make use of symbol combining in respect of the transmissions of the same redundancy version in different subframes and can make use of cyclic RV (incremental redundancy) techniques in respect of the transmissions of the different redundancy versions in a manner similar to that represented in FIG. 8, but can additionally be less prone to narrowband frequency fading because of the additional use of frequency hopping.

Figure 11:
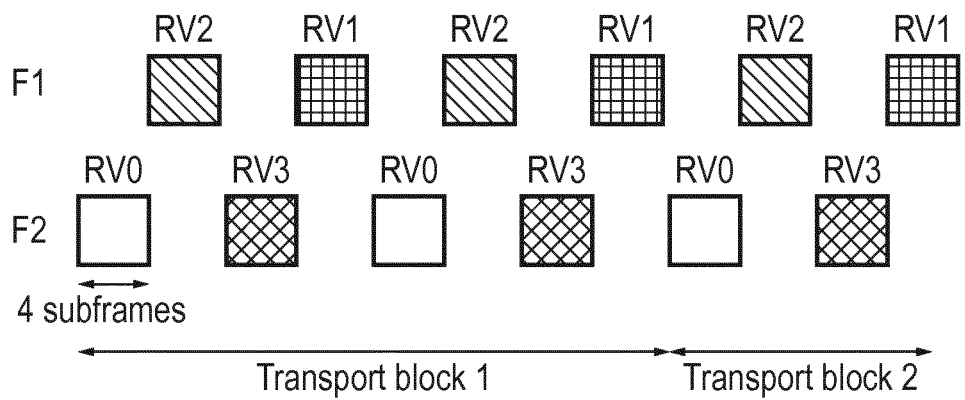

FIG. 11 is similar to, and will be understood from, FIG. 10, but represents a greater number of subframes (i.e. a longer period of time). The respective groups of four subframes using the same redundancy version represented in FIG. 10 are shown in FIG. 11 as single blocks for simplicity. That is to say, each separate block in FIG. 11 represents four subframes to which the same redundancy version is applied (i.e. as schematically indicated by the labelling beneath the leftmost block). The subframes associated with different redundancy versions are also differently shaded/hatched in FIG. 11. In particular, subframes associated with redundancy version RV0 are shown in uniform grey, subframes associated with redundancy version RV1 are shown with horizontal hatching, subframes associated with redundancy version RV2 are shown with diagonal hatching, and subframes associated with redundancy version RV3 are shown with diagonal brick hatching. A similar shading/hatching scheme is used to identify subframes/transmissions associated with different redundancy versions in various other figures.

FIG. 11 represents a scenario in which a first transport block (transport block 1) is repeated 32 times, namely, in time order starting from the left of the figure:
  4 subframes using RV0 with transmissions in frequency band F2
  4 subframes using RV2 with transmissions in frequency band F1
  4 subframes using RV3 with transmissions in frequency band F2
  4 subframes using RV1 with transmissions in frequency band F1
  4 subframes using RV0 with transmissions in frequency band F2
  4 subframes using RV2 with transmissions in frequency band F1
  4 subframes using RV3 with transmissions in frequency band F2
  4 subframes using RV1 with transmissions in frequency band F1

Thus the receiver can make use of both symbol combining and RV cycling (LLR combining) approaches, and furthermore the various repeat transmissions are spread across two frequency bands to help reduce any impact of narrowband fading that may arise in respect of one or other frequency band (or both frequency bands at different times).

After the 32 subframes comprising repeat transmissions associated with transport block 1, the following subframes are associated with transmissions of the next transport block to be transmitted, i.e. transport block 2, which 16 repetitions (i.e. for blocks of four subframes) are represented in FIG. 11 for this transport block.

These kinds of approach for seeking to enhance communications reliability are based on generally conventional techniques.

Thus, there are established principles for use in wireless telecommunications systems to help increase the reliability of communications between a transmitting entity and a receiving entity by making use of redundancy versions and frequency hopping for repeat transmissions.

However, the inventors have recognised there is scope for improving on these established techniques. In particular, the inventors have recognised that in accordance with known techniques, each redundancy version is transmitted in the same frequency band and on a periodic basis. For example, referring to FIG. 11, transmissions using RV0 and RV3 are respectively transmitted on a periodic basis using only radio resources within the frequency band F2 while transmissions using RV2 and RV1 are respectively transmitted on a periodic basis using only radio resources within the frequency band F1. Consequently, there is a lack of frequency, time and RV diversity in respect of transmissions made using a given redundancy version, which can impact the overall performance, for example in terms of communications reliability, because RV cycling (LLR combining) diversity is compromised (i.e. communications in respect of a particular redundancy version can be repeatedly affected by narrowband frequency fading or periodic interference that coincides with the radio resources used for transmissions for that redundancy version).

To help address this issue in accordance with certain embodiments of the present disclosure, approaches are proposed in which a transmitting entity (e.g. a base station 504 in a downlink communications context or a terminal device 506, 508 in an uplink or device-to-device (D2D) communications context) is arranged to transmit a block of data (e.g. a transport block) to a receiver entity (e.g. a terminal device 506, 508 in a downlink or D2D communications context or a base station 504 in an uplink communications context) by establishing a plurality of different redundancy versions for the block of data, for example in accordance with generally conventional techniques. However, in contrast to generally conventional techniques, the transmitting entity is configured to transmit the plurality of different redundancy versions for the block of data in a first sequence order in a first time period and to transmit the plurality of different redundancy versions for the block of data in a second sequence order in a second time period, wherein the second sequence order is different form the first sequence order. That is to say, the transmitting entity is configured to transmit the redundancy versions in a different order in different time periods. The inventors have recognised this can help reduce the impact of poor channel conditions by helping to ensure the same redundancy version is transmitted on different frequency resources in the different time periods when a frequency-hopping approach is used, and also to help ensure the same redundancy version is not transmitted in accordance with a regular periodicity, which may be helpful in cases where there is a periodic source of interference that would otherwise systematically interfere with a particular redundancy version.

Figure 12:
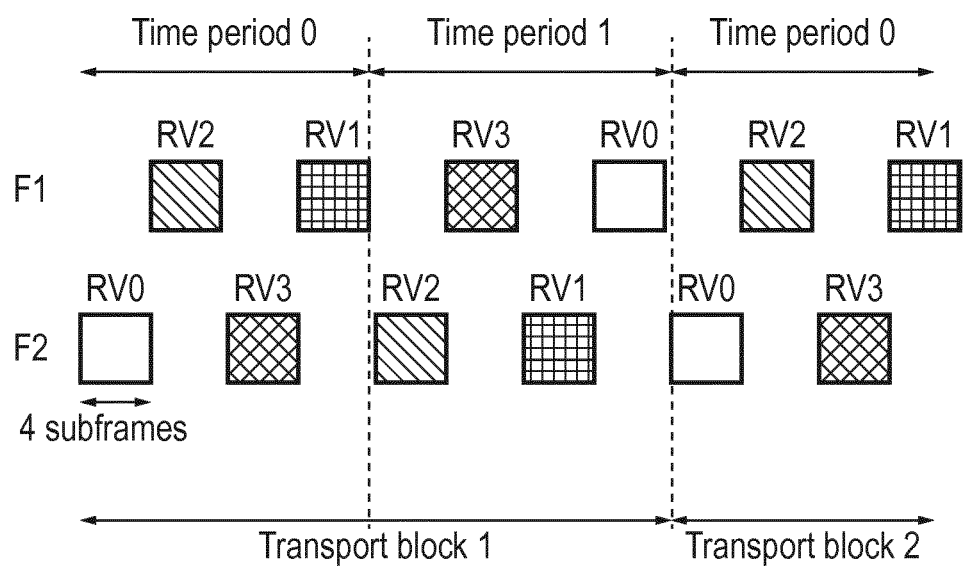
FIGS. 12 to 14 are schematic representations of approaches for using redundancy versions for repeat transmissions with frequency hopping in accordance with certain embodiments of the disclosure.

FIG. 12 is similar to, and will be understood from, FIG. 11. However, whereas in accordance with the approach of FIG. 11 the order in which the different redundancy versions are transmitted is continuously repeated (i.e. four subframes of RV0, four subframes of RV2, four subframes of RV3, four subframes of RV1, and then repeat), in the approach of FIG. 12, the order in which the different redundancy versions are transmitted is varied in different time periods. As with FIG.

11, in FIG. 12 each separate block represents four subframes to which the same redundancy version is applied. The relevant redundancy version is indicated above each block and the subframes associated with different redundancy versions are also shaded/hatched in FIG. 12 the same way as for FIG. 11.

FIG. 12 represents a scenario in which a first transport block (transport block 1) is repeated 32 times. Thus, in a first time period for transport block 1 (schematically labelled "Time period 0" in FIG. 12) there are:

4 subframes using RV0 with transmissions in frequency band F2

4 subframes using RV2 with transmissions in frequency band F1

4 subframes using RV3 with transmissions in frequency band F2

4 subframes using RV1 with transmissions in frequency band F1

And in a second time period for transport block 1 (schematically labelled "Time period 1" in FIG. 12) there are:

4 subframes using RV2 with transmissions in frequency band F2

4 subframes using RV3 with transmissions in frequency band F1

4 subframes using RV1 with transmissions in frequency band F2

4 subframes using RV0 with transmissions in frequency band F1

Thus, as described above with reference to FIG. 11, the receiver entity can make use of both symbol combining and RV cycling (LLR combining) approaches. However, significantly, in accordance with the approach represented in FIG. 12, the different redundancy versions are transmitted in a different order in the first time period as compared to the second time period. Consequently, each redundancy version is transmitted using radio resources in both frequency bands. For example, RV0 is transmitted on radio resources in frequency band F2 in the first time period and on radio resources in frequency band F1 in the second time period. Furthermore, the different redundancy versions are not transmitted in accordance with a regular and repeating periodicity, which can help reduce systematic periodic interference from impacting transmissions for one of the redundancy versions more than the others.

After the 32 subframes comprising repeat transmissions associated with transport block 1, the following subframes are associated with transmissions of the next transport block to be transmitted. In accordance with the approach represented in FIG. 12, for the transmission of the next transport block (transport block 2), the ordering of the redundancy versions reverts to the initial ordering for the transmission of transport block 1.

In the example represented in FIG. 12, the first transport block is transmitted using 32 repetitions. However, in another implementation a transport block may be transmitted using, for example, 64 repetitions. In which case there may be more than two different time periods, with the ordering of the redundancy versions in different time periods again being different.

For example, the 64 repetitions may be transmitted as follows:

In a first time period for a given transport block there may be:

4 subframes using RV0 with transmissions in frequency band F2

4 subframes using RV2 with transmissions in frequency band F1

4 subframes using RV3 with transmissions in frequency band F2

4 subframes using RV1 with transmissions in frequency band F1

And in a second time period for the transport block there may be:

4 subframes using RV2 with transmissions in frequency band F2

4 subframes using RV3 with transmissions in frequency band F1

4 subframes using RV1 with transmissions in frequency band F2

4 subframes using RV0 with transmissions in frequency band F1

And in a third time period for the transport block there may be:

4 subframes using RV3 with transmissions in frequency band F2

4 subframes using RV1 with transmissions in frequency band F1

4 subframes using RV0 with transmissions in frequency band F2

4 subframes using RV2 with transmissions in frequency band F1

And in a fourth time period for the transport block there may be:

4 subframes using RV1 with transmissions in frequency band F2

4 subframes using RV0 with transmissions in frequency band F1

4 subframes using RV2 with transmissions in frequency band F2

4 subframes using RV3 with transmissions in frequency band F1

It will of course be appreciated these are just some specific examples and different approaches may adopt different orderings in different time periods and different numbers of subframes using each redundancy version, and in principle also with different numbers of redundancy version and different numbers of frequency bands. That is to say, what is significant is not the specific configurations set out in this particular examples, but the underlying concept of transmitting a block of data using a plurality of redundancy versions arranged in a first sequence order in one time period and arranged in a second sequence order in another time period.

There are various ways in which the ordering of the redundancy versions in the different time periods may be determined. For example, each time period may correspond with the time taken to undertake four transmissions of each redundancy version (i.e. corresponding to 16 subframes), as in the example of FIG. 12, and the RV ordering in each time period may be based on different cyclic shifts of a base sequence order.

For example, a base sequence order may be defined which corresponds with that normally used in an LTE-context with four redundancy versions, i.e. {RV0, RV2, RV3, RV1}. The order to use in a given time period for a given block of data (transport block) may correspond with the base sequence order with a cyclic shift of n mod 4, where n corresponds with the time period index (where the first time period has index 0, next time period has index one, and so on until the end of the transmission of the transport block).

Thus, the ordering in different time periods with this approach would be:

Time period 0: {RV0, RV2, RV3, RV1}
Time period 1: {RV2, RV3, RV1, RV0}

Time period 2: {RV3, RV1, RV0, RV2}
Time period 3: {RV1, RV0, RV2, RV3}
Time period 4: {RV0, RV2, RV3, RV1}
Time period 5: {RV2, RV3, RV1, RV0}
Time period 6: {RV3, RV1, RV0, RV2}
Time period 7: {RV1, RV0, RV2, RV3}
etc.

Of course it will be appreciated the number of time periods associated with the transmission of a given transport block will depend on implementation (e.g. in the example of FIG. 12, there are only two time periods associated with the transmission of transport block 1).

It will of course be appreciated that the specific RV cycling pattern used may be different in different implementations, and need not follow the cyclic shift approach described above. For example, it could correspond with a cyclic shift made in the other direction (e.g. so the first two orderings might be {RV0, RV2, RV3, RV1} and {RV1, RV0, RV2, RV3}), or could be based on any predefined sequences, for example:

Time period 0: {RV0, RV2, RV3, RV1}
Time period 1: {RV2, RV3, RV1, RV0}
Time period 2: {RV0, RV1, RV3, RV2}
etc.

In another example implementation there may be 'M' different predefined sequences for the redundancy version respectively associated with an index 1 to M. In the first time period of a transport block the first RV pattern may be used (i.e. the sequence order associated with index 1); in the second time period, the second RV pattern may be used; and so on up to the M'th time period in which the M'th RV pattern may be used. In the M+1'th time period, it may return to the sequence order associated with index 1, and so on.

Thus, in one particular case of this approach with M=2, the sequence order may in effect alternate between time periods, for example so that even numbered time periods use one sequence order and odd-numbered time periods use another sequence order. Again, one of the RV patterns may be derivable from the other RV pattern (e.g. one RV pattern may be a cyclic shift of the other RV pattern), or the different RV patterns may be defined with no particular relation between them, except that they are different from one another. In an example with M=2, the two RV patterns might be {RV0, RV2, RV3, RV1} (sequence index 1) and {RV2, RV3, RV1, RV0} (sequence index 2) and their usage in the time periods may follow the sequence:

Time period 0 (even): {RV0, RV2, RV3, RV1}
Time period 1 (odd): {RV2, RV3, RV1, RV0}
Time period 2 (even): {RV0, RV2, RV3, RV1}
Time period 3 (odd): {RV2, RV3, RV1, RV0}
etc.

In another example implementation, the RV sequence order used in a given subframe may be based on a pseudo random sequence known to (or at least derivable by) both the transmitter entity and receiver entity.

It will be appreciated the principles described herein may be also be adopted in implementations which do not involve frequency hopping between two frequency bands. For example, similar approaches may be used where there are more frequency bands, for example four frequency bands, and an example of this is schematically shown in FIG. 13.

Figure 13:
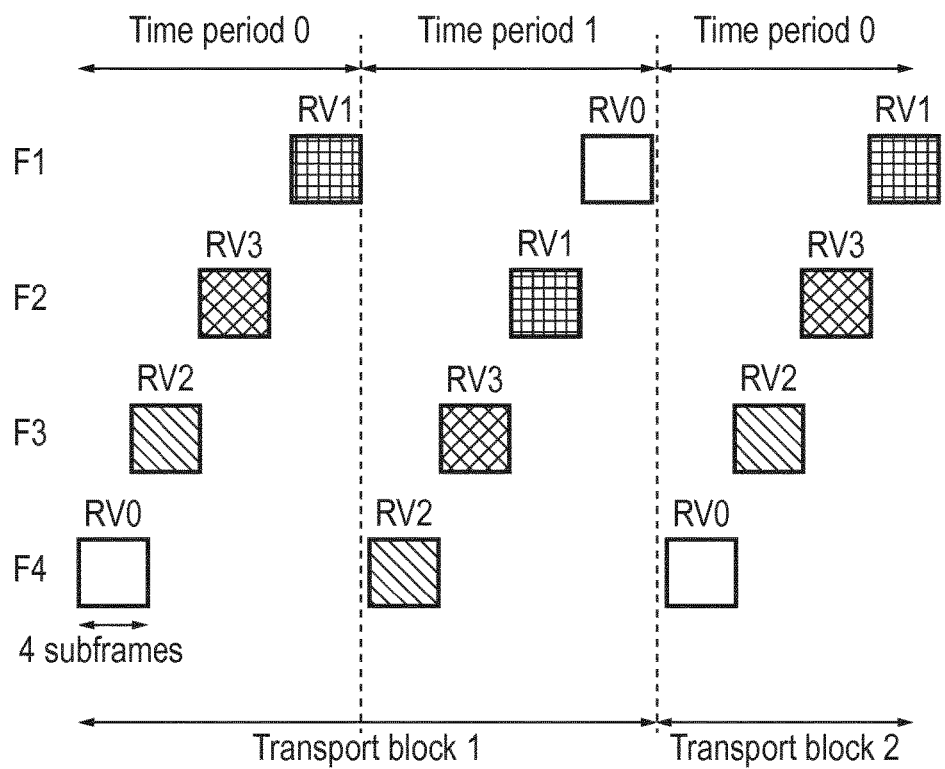

FIG. 13 is in many respects similar to, and will be understood from, FIG. 12. However, whereas FIG. 12 schematically represents an implementation supporting frequency hopping between two frequency bands, namely F1 and F2, FIG. 13 schematically represents an implementation supporting frequency hopping between four frequency bands, namely F1, F2, F3 and F4.

As with FIG. 12, in FIG. 13 each separate block represents four subframes to which the same redundancy version is applied. The relevant redundancy version is indicated above each block and the subframes associated with different redundancy versions are also shaded/hatched in FIG. 13 the same way as for FIG. 12.

FIG. 13 again represents a scenario in which a first transport block (transport block 1) is repeated 32 times. Thus, in a first time period for transport block 1 (schematically labelled "Time period 0" in FIG. 13) there are:
    4 subframes using RV0 with transmissions in frequency band F4
    4 subframes using RV2 with transmissions in frequency band F3
    4 subframes using RV3 with transmissions in frequency band F2
    4 subframes using RV1 with transmissions in frequency band F1

And in a second time period for transport block 1 (schematically labelled "Time period 1" in FIG. 13) there are:
    4 subframes using RV2 with transmissions in frequency band F4
    4 subframes using RV3 with transmissions in frequency band F3
    4 subframes using RV1 with transmissions in frequency band F2
    4 subframes using RV0 with transmissions in frequency band F1

Thus, as described above with reference to FIG. 12, the receiver can make use of both symbol combining and RV cycling (LLR combining) approaches with frequency and temporal diversity in respect of different transmissions of the same redundancy version.

After the 32 subframes comprising repeat transmissions associated with transport block 1 represented in FIG. 13, the following subframes are associated with transmissions of the next transport block to be transmitted. In accordance with the approach represented in FIG. 13, for the transmission of the next transport block (transport block 2), the ordering of the redundancy versions reverts to the initial ordering for the transmission of transport block 1.

In the examples described above, the time periods are in effect restarted at the beginning of the transmission of each new transport block. That is to say, each transport block in effect starts with the same sequence order corresponding to that used for time period 0. However, in another embodiment, the selection of the particular RV sequence order may be based on a global timing reference, such as a system frame number (SFN) rather than a timing reference which is relative to the start of a new transport block transmission. For example, in an implementation in which there are four redundancy versions transmitted four times each in each time period (i.e. for time periods having a duration of 16 subframes), the particular sequence order to use in a particular time period (i.e. in a particular block of 16 subframes) may be based on a system frame number associated with those 16 subframes. That is to say, if there are four different RV sequence orders that may be used, these may be cycled through in turn for each time period comprising 16 subframes, regardless of the timings of the transmission of particular transport blocks.

In another implementation, the same redundancy version sequence order may be used for a number of repeats, before switching to a different redundancy version sequence order. For example, the same sequence order may be used repeatedly during an attempt to successfully transmit a transport block, and only if it is determined that the transport block was not successfully received by the receiving entity, for example based on the principles of conventional acknowledgement signalling, does the transmitting entity switch to a different RV sequence order for the retransmission attempt. This approach is schematically represented in FIG. 14.

Figure 14:
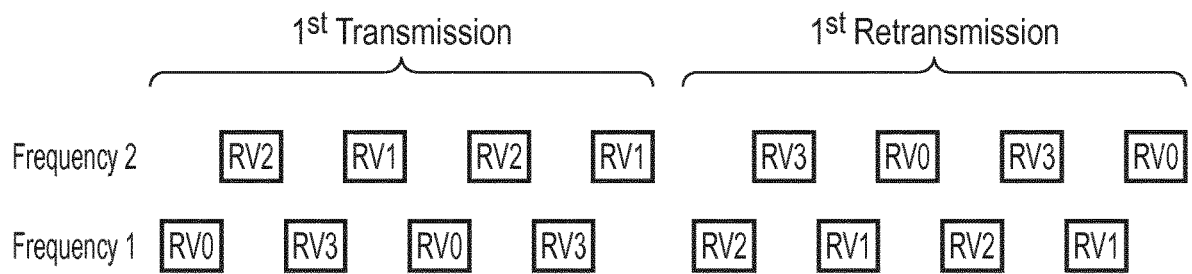

FIG. 14 is similar to, and will be generally understood from, FIG. 12 (although FIG. 14 does not include the shading/hatching for the different RVs). However, in FIG. 14, and unlike FIG. 12, the same sequence order is used throughout a first transmission attempt of a transport block, and a second, different, sequence order is used throughout a second transmission attempt (i.e. a first retransmission attempt) as schematically indicated in the figure. In this regard, the first transmission attempt may be considered to correspond with a first time period and the second transmission attempt may be considered to correspond with a second time period. Although not shown in FIG. 14, if a further retransmission is needed, for example if the second transmission (first retransmission) attempt is not successful, a third transmission (second retransmission) may be attempted with yet another different sequence order for the redundancy versions, or perhaps with the same order as for the initial attempt.

It will be appreciated there are various modifications to the approaches described above that may be made for other implementations.

For example, whereas the examples described above have focused on examples which allow for symbol combining as well as incremental redundancy combining, the same principles may be used in an approach that does not allow for symbol combining, for example in an approach where the signal is frequency hopped between every subframe, rather than having a sequence of four subframes transmitted contiguously with the same redundancy value before frequency hopping, as in the examples described above.

Furthermore, it will be appreciated that although the examples described above have focused on approaches that use frequency hopping, the same principles may be applied in other implementations which do not rely on frequency hopping. This can still be advantageous in helping to avoid what would otherwise be a regular/periodic repetition of transmissions with the same redundancy version which can help reduce the likelihood of a periodic source of interference impacting one of the redundancy versions more than the others.

Figure 15:
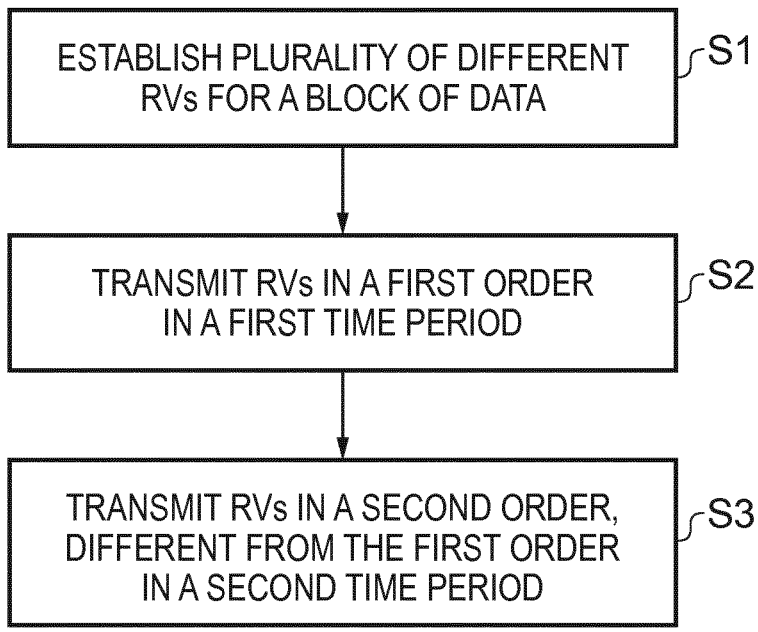
FIG. 15 is a flow diagram schematically representing a method of operating a transmitting entity in a wireless telecommunications system in accordance with certain embodiments of the disclosure.

FIG. 15 is a flow diagram schematically representing a method of transmitting a block of data from a transmitter entity to a receiver entity in a wireless telecommunication system in accordance with the principles described herein. Thus, in step S1 the transmitter entity establishes a plurality of different redundancy versions for the block of data. In a second step S2, the transmitter entity transmits the plurality of different redundancy versions for the block of data in a first sequence order in a first time period. In a third step S3, the transmitter entity transmits the plurality of different redundancy versions for the block of data in a second sequence order in a second time period, wherein the second sequence order is different form the first sequence order. The step of establishing the redundancy versions may be performed in accordance with conventional techniques. Furthermore, apart from the use of the different RV sequence orders in different time periods for the transmissions, the steps of transmitting the redundancy versions may otherwise be performed in accordance with conventional techniques.

Figure 16:
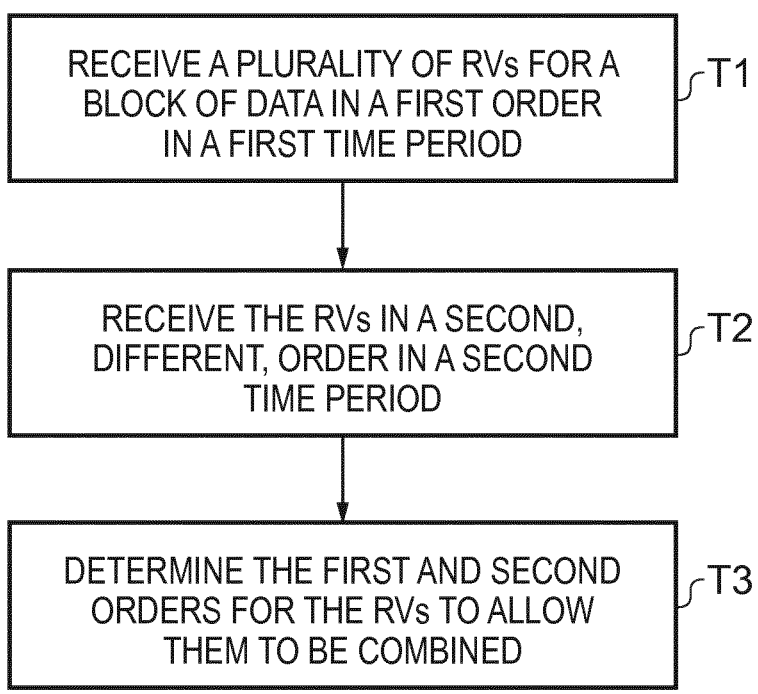
FIG. 16 is a flow diagram schematically representing a method of operating a transmitting entity in a wireless telecommunications system in accordance with certain embodiments of the disclosure.

FIG. 16 is a flow diagram schematically representing a method of receiving a block of data from a transmitter entity in a wireless telecommunication system in accordance with the principles described herein. Thus, in step T1 the receiver entity receives a plurality of different redundancy versions for the block of data in a first sequence order in a first time period, for example as transmitted by the transmitter entity in step S2 of FIG. 15. In step T2 the receiver entity receives the plurality of different redundancy versions for the block of data in a second sequence order in a second time period, wherein the second sequence order is different form the first sequence order, for example as transmitted by the transmitter entity in step S3 of FIG. 15. In step T3 the receiver entity determines the first sequence order and second sequence order, for example through knowledge of the algorithm used by the transmitter entity to determine the sequence order to use for its transmissions, to thereby allow the redundancy versions received in the different time periods to be combined.

In principle the transmitter entity could communicate an indication of the sequence order used for a given time period to the receiver entity, but in practice it may be advantageous if the receiver is able to independently determine the sequence order applicable for a given time period to save on signalling overhead. Thus, it may be appropriate for the sequence order to be used by the transmitter entity to be independently derivable by the receiver entity, for example because the sequence order for a given time period is determined in accordance with predefined rules, for example as defined in an operating standard for the wireless telecommunications system or derivable/configured in signalling previously communicated to the receiver entity, for example in association with a radio resource control connection process.

As discussed herein, in accordance with certain approaches at least some of the different redundancy versions are transmitted in different time periods using radio resources in a first frequency band and at least some of the different redundancy versions are transmitted using radio resources in a second frequency band, wherein the second frequency band is different from the first frequency band. Also, there may be frequency hopping within each time period such that at least some of the different redundancy versions are transmitted using radio resources in different frequency bands in the different time periods.

Respective ones of at least some of the different redundancy versions may transmitted multiple times in each of the first and second time periods, for example to allow for symbol combining.

As already discussed above, in accordance with some implementations a first RV sequence order may correspond with a first cyclic shift of a base sequence order and a second sequence order may corresponds with a second cyclic shift of the base sequence order. That is to say, the second sequence order (and any other sequence orders) may in effect correspond with a cyclic shift of the first sequence order.

The cyclic shift to use for a given time period may be determined from a timing associated with the time period, for example a timing relative to a global timing reference, such as a system frame number timing reference, or a timing relative to a particular transport block transmission, for example a timing relative to the start of transmission of a given transport block.

Thus there has been described a method of transmitting a block of data from a transmitter entity to a receiver entity in a wireless telecommunication system, wherein the method comprises: establishing a plurality of different redundancy versions for the block of data; transmitting the plurality of different redundancy versions for the block of data in a first sequence order in a first time period; and transmitting the plurality of different redundancy versions for the block of data in a second sequence order in a second time period, wherein the second sequence order is different form the first sequence order.

It will be appreciated that various modifications can be made to the embodiments described above without departing from the scope of the present invention as defined in the appended claims. In particular although embodiments of the invention have been described with reference to an LTE mobile radio network, it will be appreciated that the present invention can be applied to other forms of network such as GSM, 3G/UMTS, CDMA2000, etc. The term user equipment (UE) as used herein can be replaced with other terms user equipment (UE), mobile communications device, terminal device etc. Furthermore, although the term base station has been used interchangeably with eNodeB it should be understood that there is no difference in functionality between these network entities.

It will further be appreciated that while some of the above-described embodiments have focused on examples in which a base station of the wireless telecommunications system is providing functionality in accordance with the principles described herein, in other implementations similar functionality may be provided by other entities operating in the wireless telecommunications system, for example other components of the wireless telecommunications network infrastructure and/or terminal device is providing infrastructure-like functionality (for example a terminal device supporting virtual cell operation). Thus, some, or all, of the processing functionality described above in relation to a base station may be provided by a core network component of the wireless telecommunications system and/or similar functionality may be provided by other infrastructure elements or other network entities, such as relay nodes and/or dedicated units for supporting an ITS (intelligent transport system) scheme, for example roadside units (RSUs) deployed in association with a road network to facilitate vehicle-to-vehicle communications, or a terminal device providing some aspects of operating functionality more usually associated with a base station, for example a terminal device sporting a virtual cell. In this regard a base station may be considered as merely one example of network entity that may be configured to provide functionality of the kind described herein in respect of communications with a terminal device.

Further particular and preferred aspects of the present invention are set out in the accompanying independent and dependent claims. It will be appreciated that features of the dependent claims may be combined with features of the independent claims in combinations other than those explicitly set out in the claims.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, define, in part, the scope of the foregoing claim terminology such that no inventive subject matter is dedicated to the public.

Respective features of the present disclosure are defined by the following numbered paragraphs:

1. A method of transmitting a block of data from a transmitter entity to a receiver entity in a wireless telecommunication system, wherein the method comprises: establishing a plurality of different redundancy versions for the block of data; transmitting the plurality of different redundancy versions for the block of data in a first sequence order in a first time period; and transmitting the plurality of different redundancy versions for the block of data in a second sequence order in a second time period, wherein the second sequence order is different form the first sequence order.

2. The method of paragraph 1, wherein in each of the first and second time periods at least some of the different redundancy versions are transmitted using radio resources in a first frequency band and at least some of the different redundancy versions are transmitted using radio resources in a second frequency band, wherein the second frequency band is different from the first frequency band.

3. The method of paragraph 1 or 2, wherein respective ones of at least some of the different redundancy versions are transmitted using radio resources in different frequency bands in the different time periods.

4. The method of any preceding paragraph, wherein respective ones of at least some of the different redundancy versions are transmitted multiple times in each of the first and second time periods.

5. The method of any preceding paragraph, wherein the first sequence order corresponds with a first cyclic shift of a base sequence order and the second sequence order corresponds with a second cyclic shift of the base sequence order.

6. The method of paragraph 5, wherein the first cyclic shift is determined from a timing associated with the first time period and the second cyclic shift is determined from a timing associated with the second time period.

7. The method of any preceding paragraph, wherein the second sequence order corresponds with a cyclic shift of the first sequence order.

8. The method of any preceding paragraph, wherein the first and second sequence orders are predetermined in accordance with an operating standard for the wireless telecommunications system.

9. The method of any preceding paragraph, wherein the respective sequence orders are predetermined in accordance with configuration information previously received by the transmitter entity from another network entity.

10. The method of any preceding paragraph, wherein transmitting the plurality of different redundancy versions in the first sequence order in the first time period corresponds with a first attempt to successfully transmit the block of data to the receiver entity, and wherein transmitting the plurality of different redundancy versions in the second sequence order in the second time period corresponds with a second attempt to successfully transmit the block of data to the receiver entity following a determination the first attempt to successfully transmit the block of data to the receiver entity was not successful.

11. The method of any preceding paragraph, further comprising transmitting the plurality of different redundancy versions for the block of data in a further sequence order in a further time period, wherein the further sequence order is different form the first and second sequence orders.

12. The method of any preceding paragraph, further comprising transmitting the plurality of different redundancy versions for the block of data in a further sequence order in a further time period, wherein the further sequence order is the same as one of the first and second sequence orders.

13. The method of any preceding paragraph, wherein the transmitter entity is a network infrastructure element of the wireless telecommunications system or wherein the receiver entity is a network infrastructure element of the wireless telecommunications system.

14. The method of any preceding paragraph, wherein the transmitter entity is a terminal device operating in the wireless telecommunications system and/or the receiver entity is a terminal device operating in the wireless telecommunications system.

15. A transmitter entity for use in a wireless telecommunication system, wherein the transmitter entity is operable to transmit a block of data to a receiver entity, wherein the transmitter entity comprises a controller unit and a transceiver unit configured to operate together to cause the transmitter entity to: establish a plurality of different redundancy versions for the block of data; transmit the plurality of different redundancy versions for the block of data in a first sequence order in a first time period; and transmit the plurality of different redundancy versions for the block of data in a second sequence order in a second time period, wherein the second sequence order is different form the first sequence order.

16. Circuitry for a transmitter entity for use in a wireless telecommunication system, wherein the transmitter entity is operable to transmit a block of data to a receiver entity, wherein the circuitry comprises a controller element and a transceiver element configured to operate together to: establish a plurality of different redundancy versions for the block of data; transmit the plurality of different redundancy versions for the block of data in a first sequence order in a first time period; and transmit the plurality of different redundancy versions for the block of data in a second sequence order in a second time period, wherein the second sequence order is different form the first sequence order.

17. A method of receiving a block of data from a transmitter entity in a wireless telecommunication system, wherein the method comprises: receiving a plurality of different redundancy versions for the block of data in a first sequence order in a first time period; receiving the plurality of different redundancy versions for the block of data in a second sequence order in a second time period, wherein the second sequence order is different form the first sequence order; and determining the first sequence order and second sequence order to allow the redundancy versions received in the different time periods to be combined.

18. A receiver entity for use in a wireless telecommunication system, wherein the receiver entity is operable to receive a block of data from a transmitter entity, wherein the receiver entity comprises a controller unit and a transceiver unit configured to operate together to cause the receiver entity to: receive a plurality of different redundancy versions for the block of data in a first sequence order in a first time period; receive the plurality of different redundancy versions for the block of data in a second sequence order in a second time period, wherein the second sequence order is different form the first sequence order; and determine the first sequence order and second sequence order to allow the redundancy versions received in the different time periods to be combined.

19. Circuitry for a receiver entity for use in a wireless telecommunication system, wherein the receiver entity is operable to receive a block of data from a transmitter entity, wherein the circuitry comprises a controller element and a transceiver element configured to operate together to: receive a plurality of different redundancy versions for the block of data in a first sequence order in a first time period; receive the plurality of different redundancy versions for the block of data in a second sequence order in a second time period, wherein the second sequence order is different form the first sequence order; and determine the first sequence order and second sequence order to allow the redundancy versions received in the different time periods to be combined.

REFERENCES

[1] ETSI TS 136.321 v12.7.0 (2015 October)/3GPP TS 36.321 version 12.7.0 Release 12
[2] Holma H. and Toskala A, "LTE for UMTS OFDMA and SC-FDMA based radio access", John Wiley and Sons, 2009
[3] ETSI TS 136.212 v12.6.0 (2015 September)/3GPP TS 36.212 version 12.6.0 Release 12

The invention claimed is:

1. A method of transmitting a block of data from a transmitter entity to a receiver entity in a wireless telecommunication system, wherein the method comprises:
   establishing a plurality of different redundancy versions for the block of data;
   transmitting the plurality of different redundancy versions for the block of data in a first sequence order in a first time period; and
   transmitting independent of ACK/NACK signaling the same plurality of different redundancy versions for the block of data transmitted in the first time period in a second sequence order in a second time period directly proceeding the first time period without any gap in time between the first time period and the second time period, wherein the second sequence order is different from the first sequence order.

2. The method of claim 1, wherein in each of the first and second time periods at least some of the different redundancy versions are transmitted using radio resources in a first frequency band and at least some of the different redundancy versions are transmitted using radio resources in a second frequency band, wherein the second frequency band is different from the first frequency band.

3. The method of claim 1, wherein respective ones of at least some of the different redundancy versions are transmitted using radio resources in different frequency bands in the different time periods.

4. The method of claim 1, wherein respective ones of at least some of the different redundancy versions are transmitted multiple times in each of the first and second time periods.

5. The method of claim 1, wherein the first sequence order corresponds with a first cyclic shift of a base sequence order and the second sequence order corresponds with a second cyclic shift of the base sequence order.

6. The method of claim 5, wherein the first cyclic shift is determined from a timing associated with the first time period and the second cyclic shift is determined from a timing associated with the second time period.

7. The method of claim 1, wherein the second sequence order corresponds with a cyclic shift of the first sequence order.

8. The method of claim 1, wherein the first and second sequence orders are predetermined in accordance with an operating standard for the wireless telecommunications system.

9. The method of claim 1, wherein the respective sequence orders are predetermined in accordance with configuration information previously received by the transmitter entity from another network entity.

10. The method of claim 1, wherein transmitting the plurality of different redundancy versions in the first sequence order in the first time period corresponds with a first attempt to successfully transmit the block of data to the receiver entity, and wherein transmitting the plurality of different redundancy versions in the second sequence order in the second time period corresponds with a second attempt to successfully transmit the block of data to the receiver entity following a determination the first attempt to successfully transmit the block of data to the receiver entity was not successful.

11. The method of claim 1, further comprising transmitting the plurality of different redundancy versions for the block of data in a further sequence order in a further time period, wherein the further sequence order is different from the first and second sequence orders.

12. The method of claim 1, further comprising transmitting the plurality of different redundancy versions for the block of data in a further sequence order in a further time period, wherein the further sequence order is the same as one of the first and second sequence orders.

13. The method of claim 1, wherein the transmitter entity is a network infrastructure element of the wireless telecommunications system or wherein the receiver entity is a network infrastructure element of the wireless telecommunications system.

14. The method of claim 1, wherein the transmitter entity is a terminal device operating in the wireless telecommunications system and/or the receiver entity is a terminal device operating in the wireless telecommunications system.

15. A transmitter entity for use in a wireless telecommunication system, wherein the transmitter entity is operable to transmit a block of data to a receiver entity, wherein the transmitter entity comprises a controller unit and a transceiver unit configured to operate together to cause the transmitter entity to:
  establish a plurality of different redundancy versions for the block of data;
  transmit the plurality of different redundancy versions for the block of data in a first sequence order in a first time period; and
  transmit independent of ACK/NACK signaling the same plurality of different redundancy versions for the block of data transmitted in the first time period in a second sequence order in a second time period directly proceeding the first time period without any gap in time between the first time period and the second time period, wherein the second sequence order is different from the first sequence order.

16. A receiver entity for use in a wireless telecommunication system, wherein the receiver entity is operable to receive a block of data from a transmitter entity, wherein the receiver entity comprises a controller unit and a transceiver unit configured to operate together to cause the receiver entity to:
  receive a plurality of different redundancy versions for the block of data in a first sequence order in a first time period;
  receive independent of ACK/NACK signaling the same plurality of different redundancy versions for the block of data received in the first time period in a second sequence order in a second time period directly proceeding the first time period without any gap in time between the first time period and the second time period wherein the second sequence order is different from the first sequence order; and
  determine the first sequence order and second sequence order to allow the redundancy versions received in the different time periods to be combined.

17. The method of claim 1, wherein the first and second time periods comprise 32 consecutive subframes (1 to 32) for transmitting the plurality of different redundancy versions for the block of data, wherein the first time period includes subframes 1 to 16 and the second time period includes subframes 17 to 32.

18. The method of claim 17, wherein subframes 1 to 4 use a first redundancy version (RV0); subframes 5 to 8 use a second redundancy version (RV2); subframes 9 to 12 use a third redundancy version (RV3); subframes 13 to 16 use a fourth redundancy version (RV1); subframes 17 to 20 use the second redundancy version (RV2); subframes 21 to 24 use the third redundancy version (RV3); subframes 25 to 28 use the fourth redundancy version (RV1); and subframes 29 to 32 use the first redundancy version (RV0).

* * * * *